(12) United States Patent
Tanaka et al.

(10) Patent No.: US 11,469,122 B2
(45) Date of Patent: Oct. 11, 2022

(54) SEMICONDUCTOR PROCESS ANALYSIS DEVICE, SEMICONDUCTOR PROCESS ANALYSIS METHOD, AND STORAGE MEDIUM

(71) Applicant: Kioxia Corporation, Tokyo (JP)

(72) Inventors: Yukako Tanaka, Yokkaichi (JP); Sho Saiki, Yokkaichi (JP); Kaito Date, Yokkaichi (JP); Yuka Shibata, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 84 days.

(21) Appl. No.: 17/015,948

(22) Filed: Sep. 9, 2020

(65) Prior Publication Data

US 2021/0143038 A1 May 13, 2021

(30) Foreign Application Priority Data

Nov. 7, 2019 (JP) .............................. JP2019-202665

(51) Int. Cl.
*H01L 21/67* (2006.01)
*H01L 21/66* (2006.01)

(52) U.S. Cl.
CPC .. *H01L 21/67253* (2013.01); *H01L 21/67276* (2013.01); *H01L 21/67288* (2013.01); *H01L 22/20* (2013.01)

(58) Field of Classification Search
CPC ......... H01L 21/67253; H01L 21/67276; H01L 21/67288; H01L 22/20
See application file for complete search history.

(56) References Cited

U.S. PATENT DOCUMENTS 7,043,384 B2 * 5/2006 Matsushita .......... G11C 29/006
 702/81
2004/0123182 A1 * 6/2004 Cross, Jr. ................ H01L 22/20
 714/25

(Continued)

FOREIGN PATENT DOCUMENTS

JP 2005-142406 A 6/2005

OTHER PUBLICATIONS

Daniel D. Lee, et al., "Learning the parts of objects by non-negative matrix factorization." Nature, vol. 401, Oct. 21, 1999, pp. 788-791.

*Primary Examiner* — Thomas C Lee
*Assistant Examiner* — Charles Cai
(74) *Attorney, Agent, or Firm* — Oblon, McClelland, Maier & Neustadt, L.L.P.

(57) ABSTRACT

A semiconductor process analysis device of an embodiment includes a memory and a processor connected to the memory. The processor performs factoring to inspection result groups resulting from inspections of a substrate group, the inspections including an inspection of a fabrication process of a semiconductor integrated circuit. The inspection result groups are first distribution groups resulting from a single inspection of each substrate of the substrate group. Each first distribution represents a distribution of inspection data on a substrate surface. The factoring includes calculating, from the first distribution groups, for each of one or more second distributions, appearance information containing a degree of appearance of one of the one or more second distributions in each substrate. The processor calculates a degree of association between two items of the appearance information, the two items respectively corresponding to different inspection result groups among the inspection result groups.

20 Claims, 23 Drawing Sheets

(56) References Cited

U.S. PATENT DOCUMENTS

| | | |
|---|---|---|
| 2007/0288219 A1 | 12/2007 | Zafar et al. |
| 2008/0153589 A1* | 6/2008 | Baray ............... A63F 13/12 |
| | | 463/30 |
| 2011/0020956 A1* | 1/2011 | Nemoto ............. H01L 22/12 |
| | | 438/7 |
| 2013/0041494 A1* | 2/2013 | Ausschnitt ........ G05B 19/401 |
| | | 700/98 |
| 2015/0051859 A1* | 2/2015 | Chien ................ H01L 22/20 |
| | | 702/81 |
| 2016/0365262 A1* | 12/2016 | Peek .............. G05B 19/41875 |
| 2018/0157933 A1 | 6/2018 | Brauer et al. |
| 2019/0121350 A1* | 4/2019 | Cella ................ G01M 13/04 |

* cited by examiner

FIG.3

| WafID | X | Y | Value |
|---|---|---|---|
| W1 | -10 | 0 | 0.088261 |
| W1 | -9 | -4 | 0.093303 |
| W1 | -9 | -3 | 0.101629 |
| W1 | -9 | -2 | 0.06983 |
| W1 | -9 | -1 | 0.051964 |
| W1 | -9 | 0 | 0.056344 |
| W1 | -9 | 1 | 0.087073 |
| W1 | -9 | 2 | 0.080267 |
| W1 | -9 | 3 | 0.084794 |
| W1 | -9 | 4 | 0.061742 |
| W1 | -8 | -6 | 0.090713 |
| W1 | -8 | -5 | 0.082617 |
| W1 | -8 | -4 | 0.097221 |
| W1 | -8 | -3 | 0.06104 |
| ⋮ | ⋮ | ⋮ | ⋮ |

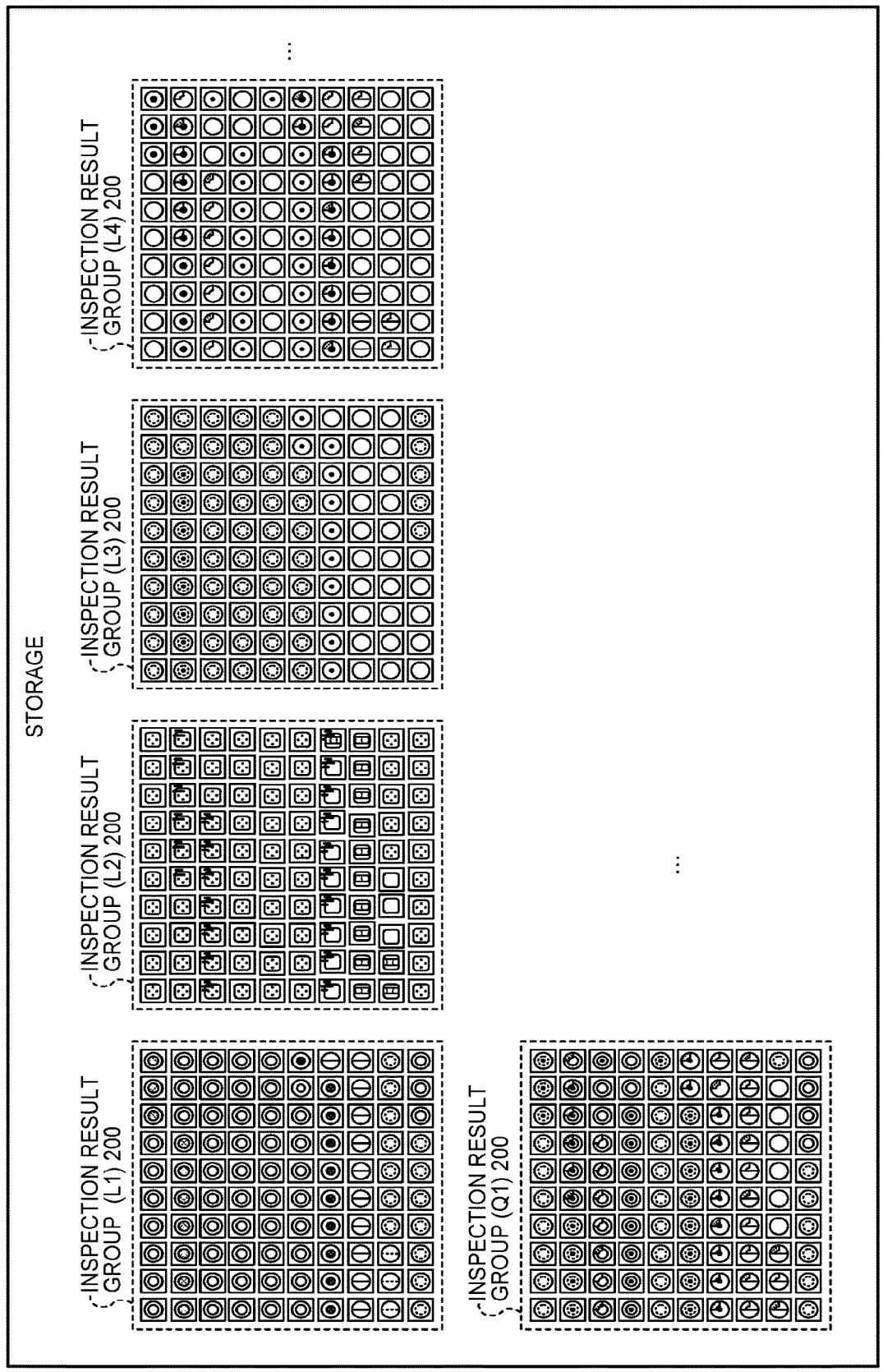

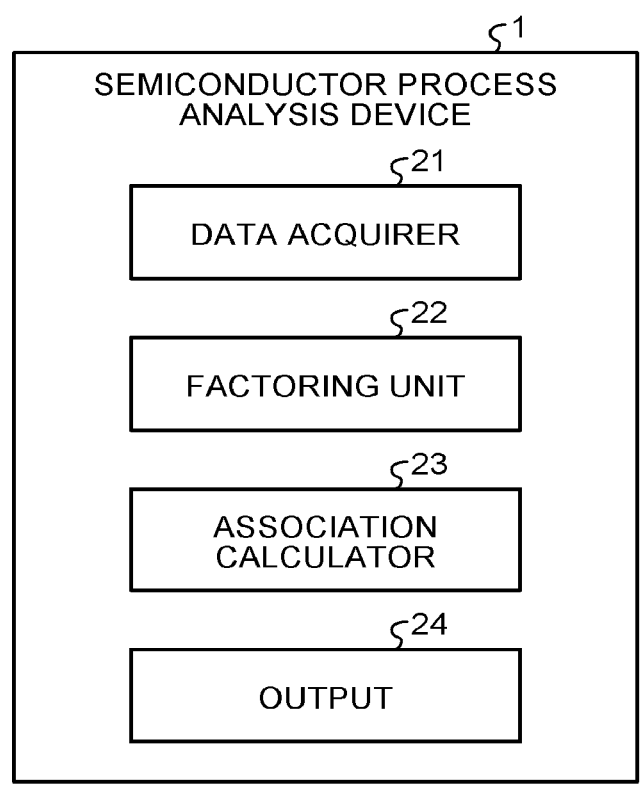

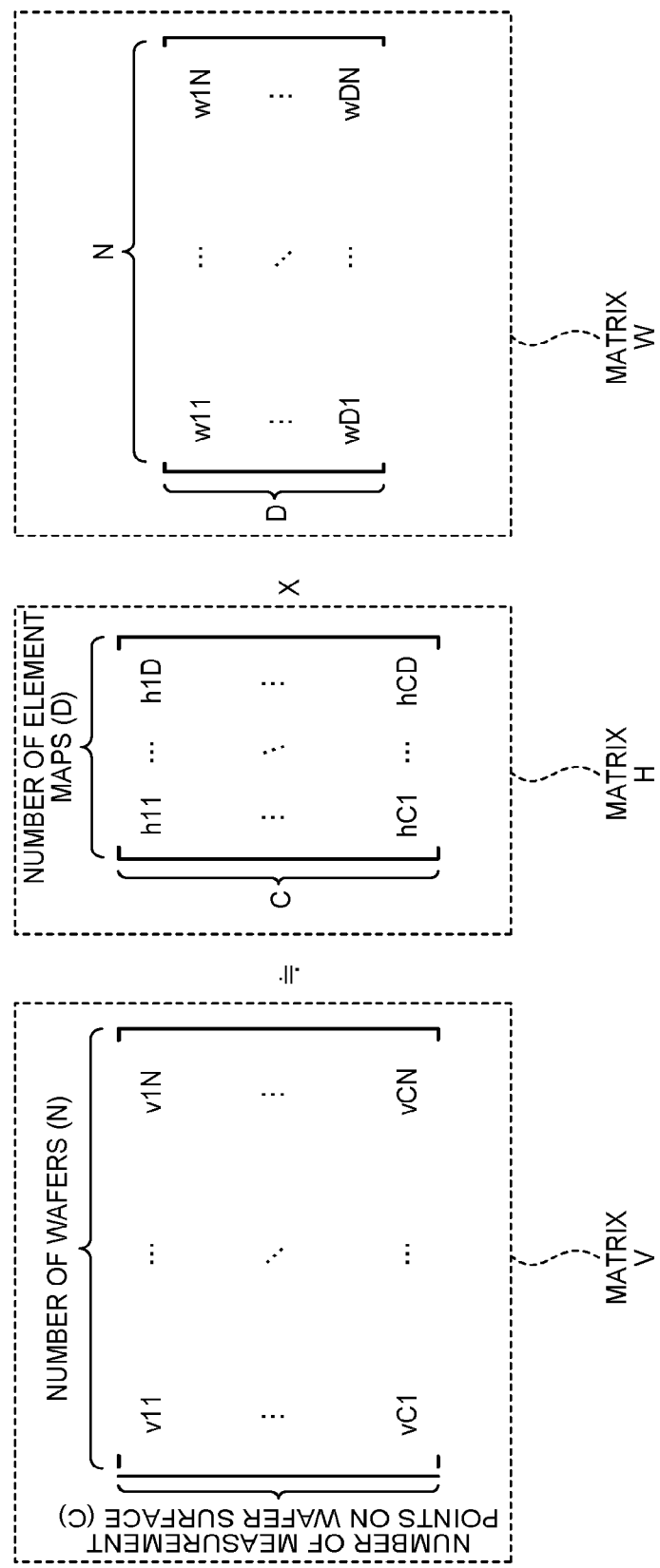

FIG.9

| | WafID | W1 | W2 | W3 | ⋯ | W98 | W99 | W100 | e-TH ROW VECTOR OF MATRIX W    [ 0.02  0.01  0.01  ⋯  0.01  0.01  0.01 ]

400

| INSPECTION ITEM | FABRICATION PROCESS |
|---|---|
| L1 | P1 |
| L2 | P2, P3, P4 |
| ⋮ | ⋮ |

SEMICONDUCTOR PROCESS ANALYSIS DEVICE, SEMICONDUCTOR PROCESS ANALYSIS METHOD, AND STORAGE MEDIUM

CROSS-REFERENCE TO RELATED APPLICATIONS

This application is based upon and claims the benefit of priority from Japanese Patent Application No. 2019-202665, filed on Nov. 7, 2019; the entire contents of which are incorporated herein by reference.

FIELD

Embodiments described herein relate generally to a semiconductor process analysis device, a semiconductor process analysis method, and a storage medium.

BACKGROUND

In a yield analysis of a substrate on which a semiconductor integrated circuit is mounted, for example, a result of an inspection of a substrate in a manufacturing line and a result of a product inspection indicating a defect are compared, to identify a fabrication process having caused the defect. However, the substrate inspection in the manufacturing line and the product inspection differ in inspection specifications such as a measuring position, the number of measurement points, or a numerical representation, which may make it difficult to directly compare the results of the two inspections.

BRIEF DESCRIPTION OF THE DRAWINGS

FIG. 3 is a schematic diagram illustrating an exemplary configuration of an inspection result of one inspection of a wafer in the first embodiment;

FIG. 5 is a schematic diagram illustrating a plurality of inspection result groups in the first embodiment;

FIG. 6 is a schematic diagram illustrating an exemplary functional configuration of the semiconductor process analysis device of the first embodiment;

FIG. 7 is a schematic diagram illustrating a factoring performed by a factoring unit using NMF in the first embodiment;

FIG. 9 is a diagram illustrating an exemplary e-th row vector of D row vectors constituting a matrix W;

DETAILED DESCRIPTION

According to an embodiment, in general, a semiconductor process analysis device includes a memory and a processor connected to the memory. The processor is configured to: perform factoring to a plurality of inspection result groups resulting from a plurality of inspections of a substrate group, the plurality of inspections including an inspection of a fabrication process of a semiconductor integrated circuit, the inspection result groups each representing a first distribution group resulting from a single inspection of each substrate of the substrate group, the first distribution representing a distribution of inspection data on a substrate surface, the factoring including calculating, from the first distribution groups, for each of one or more second distributions, appearance information containing a degree of appearance of one of the one or more second distributions in each substrate; and calculate a degree of association between two items of the appearance information, the two items respectively corresponding to different inspection result groups among the inspection result groups.

Embodiments of a semiconductor process analysis device, a semiconductor process analysis method, and a storage medium will be described in detail below with reference to the accompanying drawings. The following embodiments are presented for illustrative purpose only and not intended to limit the scope of the present invention.

First Embodiment

Figure 1:
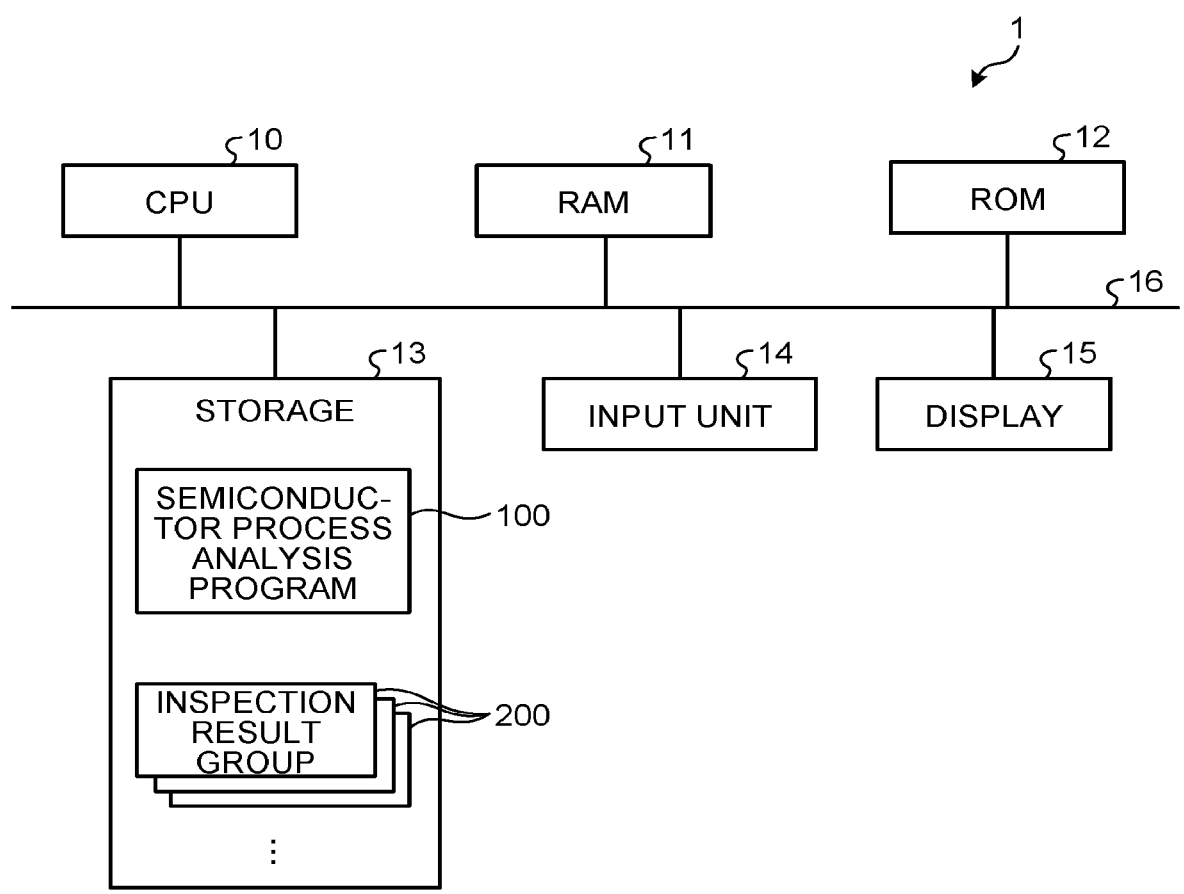
FIG. 1 is a schematic diagram illustrating an exemplary hardware configuration of a semiconductor process analysis device according to a first embodiment.

FIG. 1 is a schematic diagram illustrating an exemplary hardware configuration of a semiconductor process analysis device according to a first embodiment.

The semiconductor process analysis device 1 includes the same configuration as a typical computer serving to execute a computer program. In the example illustrated in FIG. 1, the semiconductor process analysis device 1 includes a central processing unit (CPU) 10, a random access memory (RAM) 11, a read only memory (ROM) 12, a storage 13, an input unit 14, and a display 15. The CPU 10, the RAM 11, the ROM 12, the storage 13, the input unit 14, and the display 15 are electrically connected to one another via a bus 16.

The input unit 14 serves as a human machine interface (HMI) for information input. The input unit 14 includes, for example, a pointing device or a keyboard. An operator manipulates the input unit 14 to enter information to be transmitted to the CPU 10.

The display 15 serves as an HMI which can output information as an image. The display 15 serves as an image display such as a liquid crystal display, an organic electroluminescence (EL) display, or a plasma display.

The CPU 10 serves as a processor which executes a computer program.

The RAM 11 is a volatile memory which operates faster than the ROM 12 or the storage 13. The RAM 11 provides the CPU 10 with a cache or buffer area.

The ROM 12 and the storage 13 are memories capable of storing information such as data or computer programs in a nonvolatile manner. The storage 13 can store a larger amount of information than the ROM 12. The storage 13 may include, for example, a hard disk drive (HDD), a solid state drive (SSD), or a combination thereof.

The storage 13 may be located outside the semiconductor process analysis device 1 and connected to the semiconductor process analysis device 1 via a network, for example. The storage 13 may be a detachable device such as a universal serial bus (USB) memory, a secure digital (SD) card, or an external HDD.

In the first embodiment, the storage 13 contains a semiconductor process analysis program 100 being a computer program. For example, the CPU 10 loads and executes the semiconductor process analysis program 100 from the storage 13 into the RAM 11. The CPU 10 implements the function of the semiconductor process analysis device 1 by the semiconductor process analysis program 100 loaded in the RAM 11.

The storage 13 stores a plurality of inspection result groups 200 found through two or more items of inspection of a substrate group on which semiconductor integrated circuits are mounted.

The substrate is exemplified by a circular silicon wafer on which a large number of semiconductor integrated circuits are mounted before individually divided. The material of the substrate is not limited to silicon. The shape of the substrate may not be circular. The substrate may have one semiconductor integrated circuit mounted thereon. The substrate may be a chip after being divided. Hereinafter, a silicon wafer as the substrate will be simply referred to as a wafer.

Figure 2:
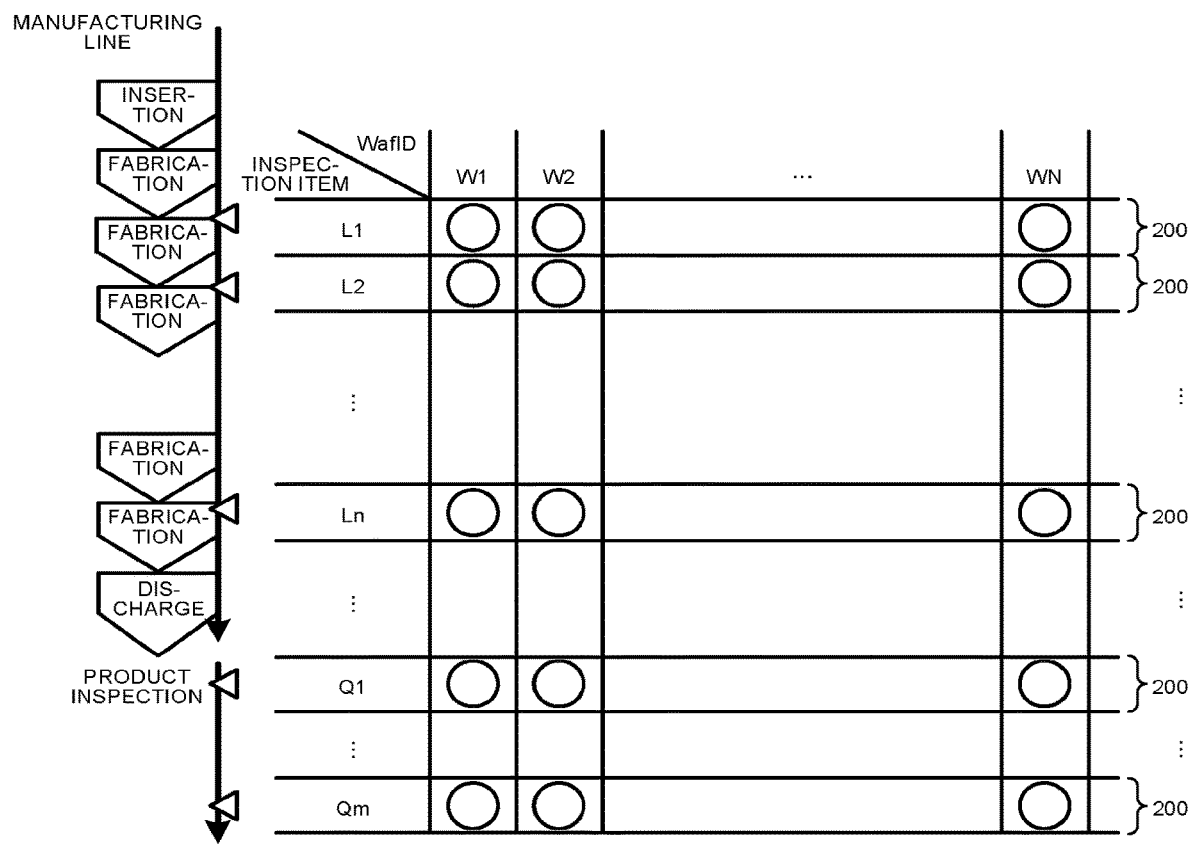
FIG. 2 is a schematic diagram illustrating a plurality of inspection result groups of different inspections in the first embodiment.

FIG. 2 is a schematic diagram illustrating a plurality of inspection result groups 200 of different inspections in the first embodiment.

In a manufacturing line of semiconductor integrated circuits, a plurality of wafers is subjected to a plurality of fabrication processes. In the example illustrated in FIG. 2, the number N of wafers (N is an integer of two or more) with wafer IDs (WafID) W1 to WN are inserted into the manufacturing line and subjected to fabrication processes sequentially.

The fabrication processes include, for example, cleaning, deposition, resist coating, exposure, and etching. Examples of the fabrication process are not limited thereto.

A given inspection is conducted in a part of the fabrication processes. The given inspection may be conducted in each of the fabrication processes or two or more inspections may be conducted in a single fabrication process. In the example illustrated in FIG. 2, the number n (n is an integer of two or more) of inspections with inspection item IDs L1 to Ln are conducted in different fabrication processes.

One physical index is acquired through each inspection conducted in a fabrication process. Examples of the physical index includes a dimension, a film thickness, a defect, a top view, a density, reflectance or an attenuation factor of a wavelength, a mass, and a surface unevenness. The physical index is not limited to these examples.

Two or more inspections through which the same physical index is obtained may be treated as different inspections if conducted in different fabrication processes. For example, a certain dimension may be measured in the both inspections with item IDs L1 and L2.

After completion of the fabrication in the manufacturing line, the N wafers are subjected to one or more product inspections. In the example illustrated in FIG. 2, the N wafers undergo the number m (m is an integer of one or more) of product inspections with item IDs Q1 to Qm.

One quality index is acquired through each product inspection. Examples of the quality index include an operation speed, a standby current value, a trimming voltage value, the number of defective bits, and a count of used redundancy units. The quality index is not limited to these examples.

Thus, the N wafers are subjected to two or more inspections with item IDs L1 to Ln and Q1 to Qm. By each of the inspections, a group of results of inspections of the N wafers is obtained. The group of results of one inspection of the N wafers corresponds to the inspection result group 200.

FIG. 3 is a schematic diagram illustrating an exemplary configuration of a result of one inspection of wafers in the first embodiment. As illustrated in FIG. 3, the result of one inspection includes a plurality of items of inspection data (see the item Value in FIG. 3). Each item of inspection data is associated with a position (see the items X and Y in FIG. 3) on the wafer surface. That is, the inspection result of each wafer includes inspection data of each of measurement positions set on the wafer surface.

Figure 4:
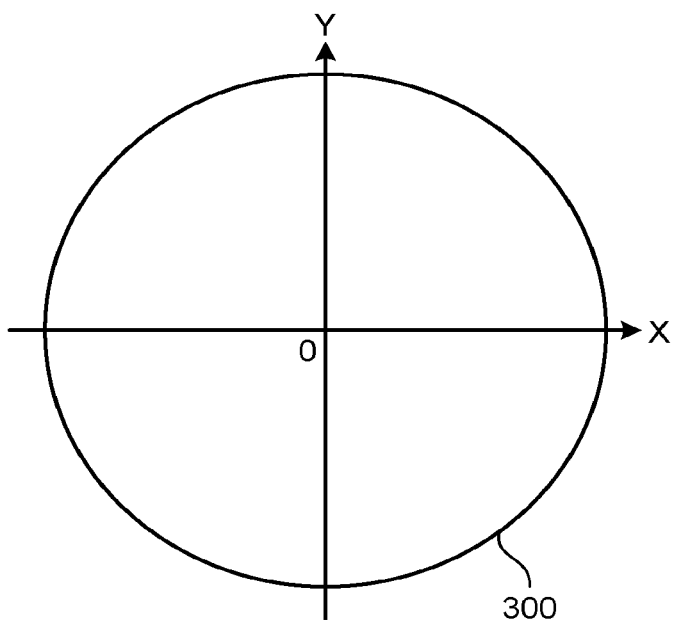
FIG. 4 is a schematic diagram illustrating an exemplary coordinate system that represents positions on a wafer surface associated with inspection data in the first embodiment.

The positions on the wafer surface are represented by coordinate values in an XY coordinate system with the center of the wafer 300 set to the origin, for example, as illustrated in FIG. 4. The coordinate system representing the positions on the wafer surface is not limited thereto.

FIG. 5 is a schematic diagram illustrating the inspection result groups 200 according to the first embodiment. FIG. 5 illustrates four inspection result groups 200 of the four inspection items L1 to L4 and the inspection result group 200 of the inspection item Q1, as an example. As illustrated FIG. 5, each inspection result group 200 includes 100 circles representing the inspection results of 100 wafers with wafer IDs W1 to W100. In the inspection result of each wafer, the magnitude of the inspection data is represented by a contrast value. It can be seen from FIG. 5 that constant inspection data exhibits a constant contrast value on a wafer surface and a variation in inspection data appears as a variation in contrast values on a wafer surface.

Thus, through each inspection, the inspection result group 200, i.e., a group of inspection data distributions on the wafer surfaces of two or more wafers (100 in the example of FIG. 5) is found. That is, the inspection result group 200 represents a group of inspection data distributions on the wafer surfaces of the wafers by a single inspection.

Hereinafter, the inspection data distribution on the wafer surface will be referred to as an original map. The original map and an element map described later may be collectively referred to as a map. The original map is an exemplary first distribution. The element map is an exemplary second distribution.

In each inspection, the inspection specifications of the original map are independently set according to a purpose. Examples of the inspection specifications of the original map include the number of measurement points on the wafer surface, measurement positions set on the wafer surface, and representation of the inspection data such as an integer or a real number.

For example, in a dimension or film-thickness inspection, the inspection data representing measured values such as dimension or film thickness is acquired from multiple points preset on the wafer surface. Through the dimension or film-thickness inspection, a group of inspection data associated with the preset points is found as an original map.

In a top view inspection, a wafer may be imaged with an imaging device to generate image data, e.g., a bitmap. The image data can be set to the original map. That is, the original map obtained from the top view inspection is constituted of intensity signals of light which is reflected by each position on the wafer and incident on image sensors arranged in a matrix. The number of measurement points depends on the number of the image sensors.

In a defect inspection, patterns on a wafer is inspected to find if there is a defect. A defect in the patterns refers to, for example, a short circuit or a disconnection. By a defect inspection, the count of defects in each semiconductor integrated circuit may be acquired as an original map.

By operation-speed inspection, for example, a set of detected values of the operation speed of each semiconductor integrated circuit is acquired as an original map.

The inspection specifications of each original map described above are merely exemplary. Examples of the inspection specifications of each original map are not limited to the above examples.

Assumed that a value considered as inferior quality is detected by a certain product inspection. If the appearing pattern of a certain feature in an inspection result group 200 of a fabrication process is similar to the appearing pattern of the value considered as inferior quality in the product inspection, through comparison between the original maps of each inspections of the same wafer, it may be inferred that the inferior quality is caused by the fabrication process in which the inspection result group 200 concerned is found. The fabrication process causing the inferior quality can be identified by comparing the inspection result groups 200 with one another.

However, since the inspection specifications of the original maps are different in each inspection as described above, it is difficult to directly compare the original maps of different inspections.

According to the first embodiment, the semiconductor process analysis device 1 calculates one or more element maps from one inspection result group 200, and calculates, for each element map, appearance information containing the degree of appearance of the element map on each wafer. In this disclosure, the calculation of the appearance information of each element map is referred to as factoring. The one or more element maps each represent observed features of a part or all of the N original maps of one inspection result group 200. The semiconductor process analysis device 1 calculates appearance information for each inspection result group 200, i.e., for each inspection item. The semiconductor process analysis device 1 calculates the degree of association between two items of appearance information obtained from different inspection result groups 200.

The degree of association represents the degree of co-occurrence between features of two element maps on the same wafers. If a co-occurrence between two element maps of two inspection result groups 200 is found, it can be inferred that the features of the two element maps appear due to the same factor. The features of the two element maps appearing due to the same factor are likely to be similar in terms of the form of distributions. Thus, the semiconductor process analysis device 1 determines whether or not two inspection result groups 200 have similar feature appearing patterns by calculating the degree of association between items of appearance information.

Appearance information represents a set of N items of numerical information, specifically, the degrees of appearance. The N items of numerical information correspond to the N wafers one by one. The data structure of such appearance information is independent of the inspection result groups 200 from which the appearance information is calculated, and is common to the inspection result groups 200. This facilitates the comparison between items of appearance information obtained from different inspection result groups 200.

The semiconductor process analysis device 1 evaluates the degree of association between inspection result groups 200 by directly comparing items of appearance information indicating the degrees of appearance of element maps on the N wafers. That is, the semiconductor process analysis device 1 can determine whether two of inspection result groups 200 exhibit similar feature appearing patterns or not, without directly comparing the original maps.

FIG. 6 is a schematic diagram illustrating an exemplary functional configuration of the semiconductor process analysis device 1 according to the first embodiment. As illustrated in FIG. 6, the semiconductor process analysis device 1 includes a data acquirer 21, a factoring unit 22, an association calculator 23, and an output 24.

The data acquirer 21 acquires the inspection result groups 200 from the storage 13. As described above, the inspection result group 200 refers to a set of N original maps of N different wafers acquired by a single inspection. The coordinate systems of the inspection result group 200 may differ from one inspection result group to another. In such a case the data acquirer 21 may convert the respective coordinate systems to the same coordinate system at the time of acquiring the original maps.

The factoring unit 22 performs factoring to each inspection result group 200.

The method of factoring or factorization is not limited to a particular method. As an example, one or more element maps and appearance information on each element map are calculated by non-negative matrix factorization (NMF). NMF refers to an algorithm for approximating one original matrix of non-negative values to the product of two matrices of nonnegative values. In other words, the original matrix is factorized into two matrices by NMF.

FIG. 7 is a schematic diagram illustrating a process of factoring by the factoring unit 22 using NMF in the first embodiment.

The left member of FIG. 7 is a matrix representing one inspection result group 200, and the matrix is subjected to factoring. This matrix is referred to as a matrix V. The factoring unit 22 factorizes the matrix V into two matrices H and W by NMF.

The matrix V includes C rows by N columns. The N column vectors of the matrix V correspond to the N wafers. As one example, X-th (X is an integer of one or more and N or less) column vector of the matrix V represents the original map of the wafer with the wafer ID WX. The correspondence between the column vectors and the wafers is common to the inspection result groups 200. C elements constituting one column vector of the matrix V represent the inspection data at C points constituting the original map of the wafer corresponding to the column vector. The number C of elements of one column vector may differ from one inspection to another, depending on the number of measurement points specified in the inspection specifications. The order of C elements in N column vectors of inspection data is common. The inspection data of the same location on a wafer surface, indicated by the same coordinate value, is arranged at the same position in each column vector.

The matrix H includes C rows by D columns. D column vectors constituting the matrix H correspond to D element maps. One column vector of the matrix H represents one element map. C elements constituting one column vector of the matrix H represent data of an element map corresponding to the column vector. That is, one element map is represented by data of C points. The positional relationship between C elements of data in a column vector and locations on a wafer surface is common to the matrix H and the matrix V.

FIG. 8A to 8D are diagrams illustrating exemplary graphical element maps represented by the matrix H calculated by factoring in the first embodiment. In FIG. 8A to 8D, the element map is made of binary data, and the element map is represented by two colors, white and black, corresponding to the binary data. The data of the element map is not limited to binary data.

Figure 8A:
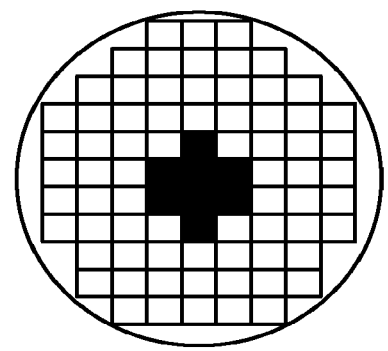
FIGS. 8A to 8D are diagrams illustrating exemplary graphic element maps indicated by a matrix H found by factoring in the first embodiment.
Figure 8B:
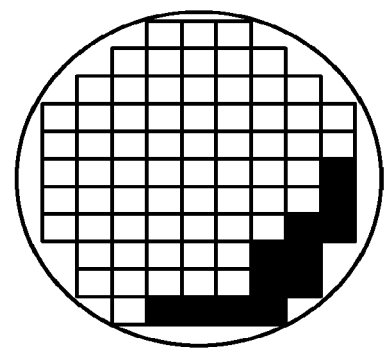
Figure 8C:
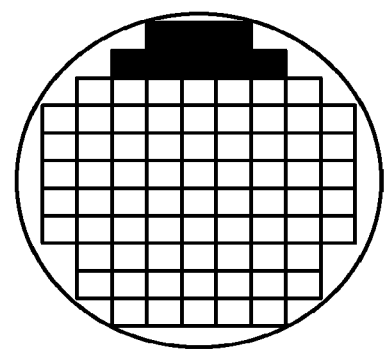
Figure 8D:
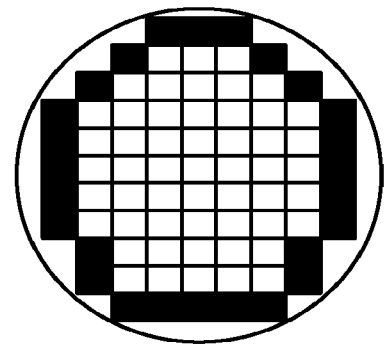

As illustrated in FIGS. 8A to 8D, the element maps represent various features of the original map. For example, the element map illustrated in FIG. 8A shows that the wafer exhibits significantly different features in the center from the rest in terms of the magnitude of the value. The element map illustrated in FIG. 8B shows that the wafer exhibits significantly different features in right bottom from the rest in terms of the magnitude of the value. The element map illustrated in FIG. 8C shows that the wafer exhibits significantly different features in the top part from the rest in terms of the magnitude of the value. The element map illustrated in FIG. 8D shows that the wafer exhibits significantly different features in the periphery from the rest in terms of the magnitude of the value.

By NMF, one or more element maps are represented by the column vectors of the matrix H. The element maps and the number of element maps to be found may differ depending on the matrix V subjected to NMF. That is, the matrix H may include only one column vector or two or more column vectors.

Referring back to FIG. 7, the matrix W includes D rows by N columns. The N column vectors constituting the matrix W correspond to the N wafers. The correspondence between the column vectors and the wafers is common to the matrix W and the matrix V. D elements constituting one column vector represent the respective degrees of appearance of the D element maps in the original map of the wafer corresponding to the column vector.

The degree of appearance refers to numerical information indicating the ratio of the element map in the original map. The degree of appearance can also be considered as a weight by which each element map is multiplied when each original map is regarded as a weighted sum of the D element maps represented by the matrix H. The matrix W includes one or more factors (one or more element maps in this disclosure) found by factoring and multiplied by weights. The matrix W may be referred to as an activation matrix.

The row vectors of the matrix W are now described. FIG. 9 illustrates an exemplary e-th row vector of the D row vectors constituting the matrix W. The row vector corresponds to the e-th column vector of the D column vectors constituting the matrix H. The e-th row vector of the matrix W includes the degree of appearance of the element map represented by the e-th column vector of the matrix H, in other words, the weighted value for each wafer. That is, the e-th row vector of the matrix W corresponds to the appearance information 400 on the element map represented by the e-th column vector of the matrix H.

The order of arrangement of N degrees of appearance constituting the appearance information 400 corresponds to the order of arrangement of the N column vectors of the matrix V. If the N column vectors of the matrix V are arranged in the order of wafer IDs, as illustrated in FIG. 9, the appearance information 400 of each element map includes the degrees of appearance arranged in the order of wafer IDs.

For example, it can be seen from FIG. 9 that the degree of appearance of the e-th element map, represented by the e-th column vector of the matrix H, for the wafer W1 is 0.02. The degree of appearance of the corresponding element maps of the wafers W2, W3, W98, W99, and W100 is 0.01.

Thus, the factoring unit 22 can calculate one or more element maps and the appearance information 400 on each element map by NMF.

Figure 10:
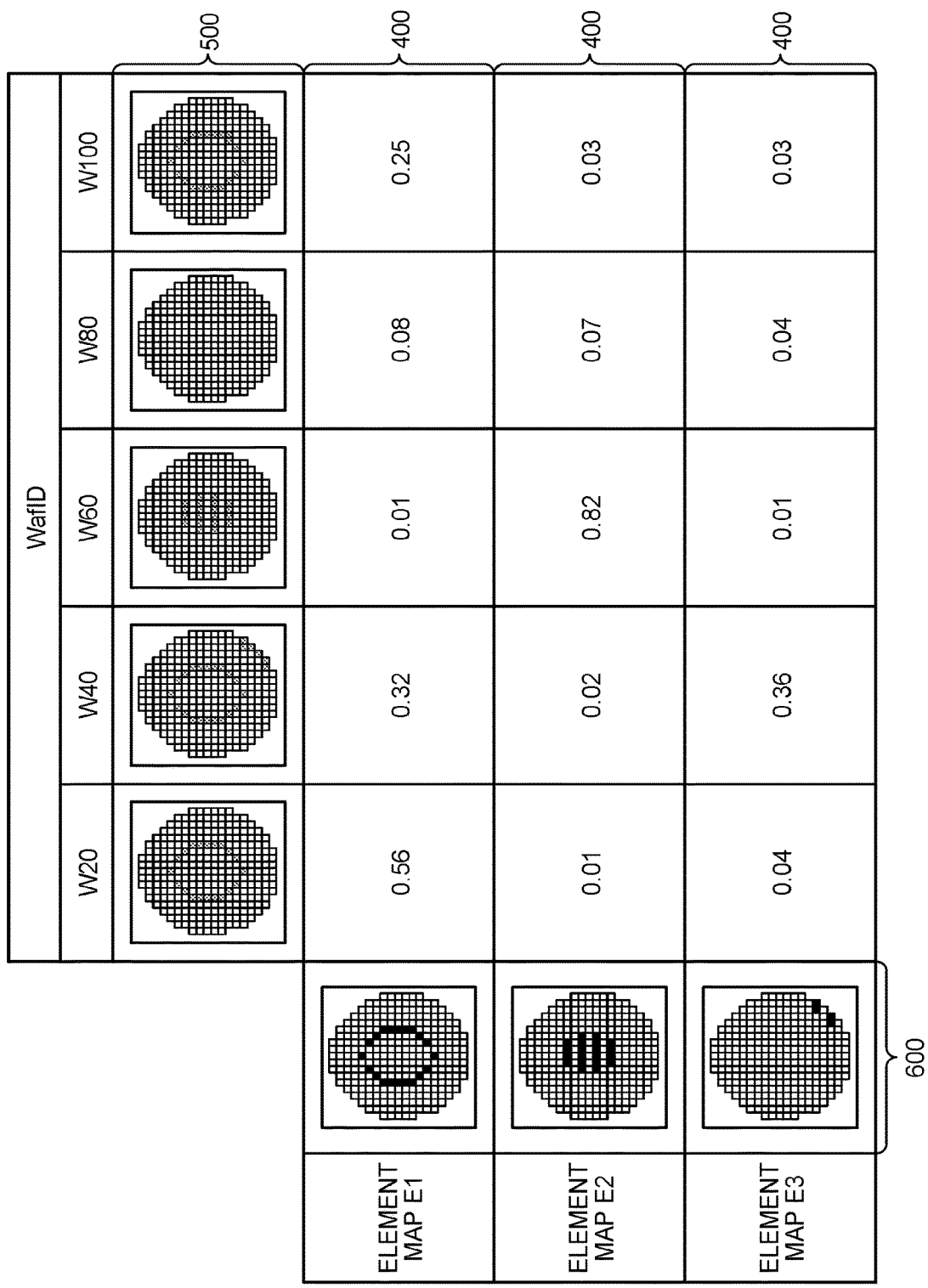
FIG. 10 is a schematic diagram illustrating an example of one or more element maps calculated by the factoring unit and appearance information on each element map in the first embodiment.

FIG. 10 is a schematic diagram illustrating one or more element maps and the appearance information 400 of each element map calculated by the factoring unit 22 in the first embodiment, by way of example. For the sake of better viewability, FIG. 10 depicts the degrees of appearance of the wafers W20, W40, W60, W80, and W100 among the wafers W1 to W100 in a table format, and omit depicting the rest thereof. In the table, a field 500 graphically shows the original maps of the wafers, and a field 600 graphically shows the element maps.

It can be seen from this table that an element map E1, an element map E2, and an element map E3 are calculated. For example, in the original map of the wafer W40, the feature represented by the element map E1 appears at a rate of 0.32, the feature represented by the element map E2 appears at a rate of 0.02, and the feature represented by the element map E3 appears at a rate of 0.36. That is, the original map of the wafer W40 contains mainly the features of the two element maps E1 and E3.

As with the wafer W60, the original map may contain mainly the features of the element map E2 among the element maps E1 to E3. As with the wafer W80, the original map may contain no features of the element maps E1 to E3.

Among the groups of degrees of appearance in this table, the group of degrees of appearance of a single element map of the N wafers corresponds to one item of appearance information 400. That is, in the example illustrated in FIG. 10, the appearance information 400 is calculated for each of the element maps E1 to E3.

The details of the factoring using NMF are not limited to the above method. The factoring unit 22 can perform calculation to an optional matrix in any manner, such as adding or subtracting an offset value, multiplying a constant, or dividing by a constant.

A method of calculating one or more element maps and the appearance information 400 of each element map is not limited to the method using NMF. The factoring unit 22 may calculate one or more element maps and the appearance information 400 of each element map by any method.

For example, the factoring unit 22 may calculate one or more element maps by map classification using clustering. The factoring unit 22 may calculate the degree of appearance of each of the calculated element maps by cosine similarity.

Referring back to FIG. 6, the association calculator 23 calculates the degree of association between two items of appearance information 400 calculated from different inspection result groups 200. Herein, the association calculator 23 calculates a correlation coefficient as the degree of association, as an example.

Figure 11:
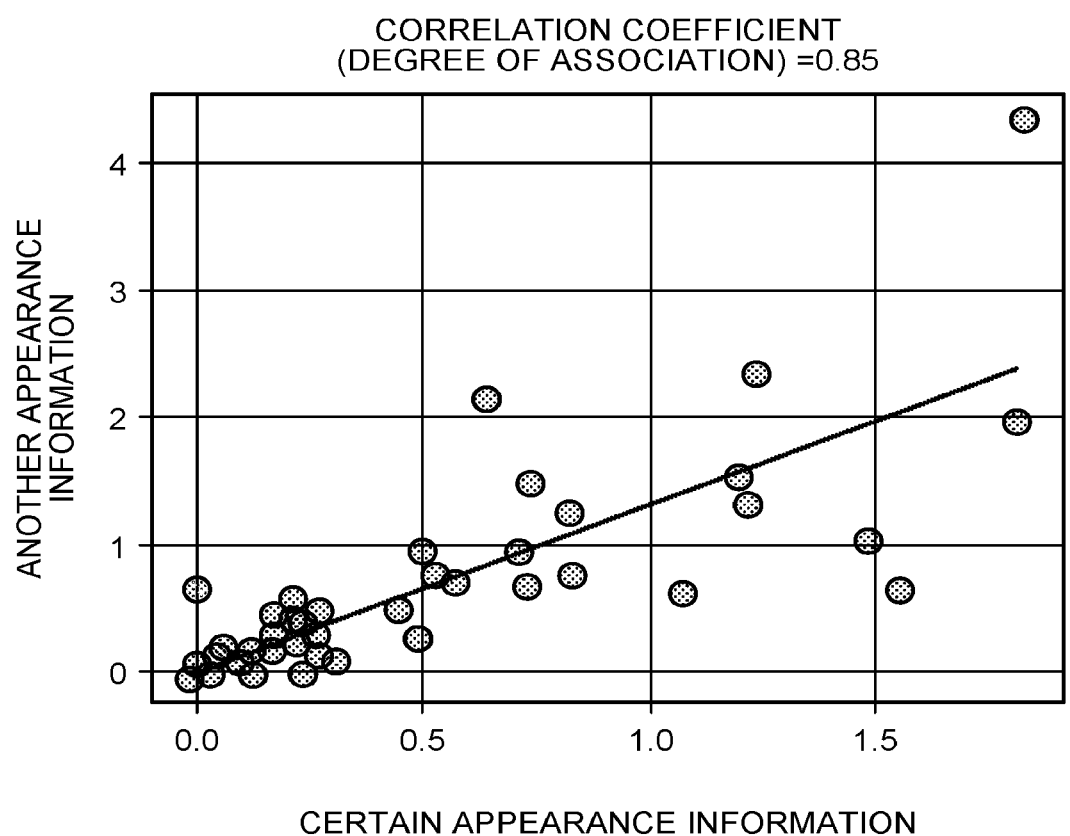
FIG. 11 is a diagram illustrating an exemplary correlation coefficient between two items of appearance information calculated as a degree of association in the first embodiment.

FIG. 11 is a diagram illustrating an exemplary correlation coefficient between two items of appearance information 400 calculated as the degree of association in the first embodiment. FIG. 11 illustrates an example of calculating a correlation coefficient between certain appearance information 400 calculated from an inspection result group 200 and another appearance information 400 calculated from another inspection result group 200. It is found that the correlation coefficient between the two items of appearance information 400, that is, the degree of association is 0.85. As the correlation coefficient increases, the degree of association between the two items of appearance information 400 increases.

The method of calculating the degree of association between the items of appearance information 400 is not limited to the above method. The degree of association can be defined to be optional numerical information as long as the numerical information indicates the degree of co-occurrence between the features of two element maps of the same wafer. Examples of the degree of association may include cosine similarity, Euclidean distance, and Kullback-Leibler (KL) divergence.

In the case of two items of appearance information 400 to compare being both quantitative data, the numerical information accurately representing the degree of association between the two items of appearance information 400 can be found from a correlation coefficient, a cosine similarity, Euclidean distance, or a KL divergence, for example. In the case of one or both of the two items of appearance information 400 to compare being categorical data, however, the numerical information accurately representing the degree of association between the two items of appearance information 400 cannot be found from the correlation coefficient and else. In such a case, an evaluation index such as accuracy or F-measure can serve as an index for the degree of association between the items of the appearance information 400.

Figure 16:
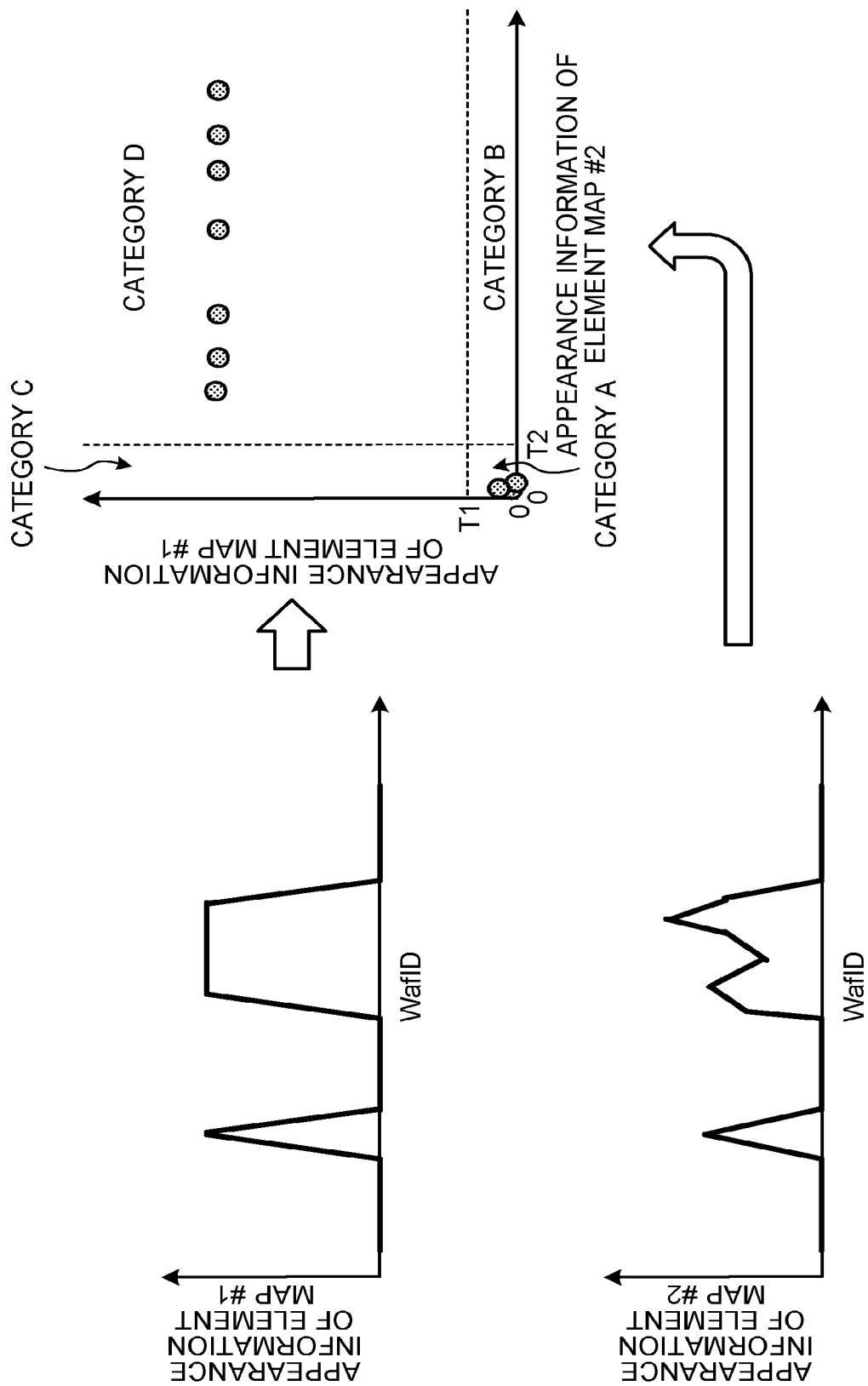
FIG. 16 is a diagram illustrating an exemplary method of calculating an accuracy or an F-measure as the degree of association in the first embodiment.

FIG. 16 is a diagram illustrating an exemplary method of calculating the accuracy or F-measure as the degree of association.

For example, with no occurrence of a given event, the degree of appearance of the element map #1 take a value of zero while with occurrence of a given event, the degree of appearance takes a given value, for example, one. Thus, the appearance information 400 of the element map #1 corresponds to categorical data.

Meanwhile, the degree of appearance of the element map #2 can take a continuous value from zero to a given value, for example, 100. Thus, the appearance information 400 of the element map #2 corresponds to quantitative data. The degree of appearance of the element map #2 represents a defect density as one example.

There may be a situation that the degree of appearance of the element map #2 increases or decreases depending on occurrence or no occurrence of an event represented by the degree of appearance of the element map #1, which is regarded as a co-occurrence relationship at a high level. In such a situation, the evaluation index such as correlation coefficient is still insufficient to find the numerical information accurately representing the level of the co-occurrence relationship.

In this case, for example, the association calculator 23 classifies the wafers from which the appearance information 400 of the element map #1 is obtained, using a threshold value T1 where T1 is a value greater than zero and less than one. Further, the association calculator 23 classifies the wafers from which the appearance information 400 of the element map #2 is obtained, using a threshold value T2 where T2 is a value greater than zero and less than 100. As one example, T2 is defined as a small value close to zero.

The N wafers can be classified into four categories A to D by the comparison between the appearance information of the element maps #1 and #2, using the threshold values T1 and T2. That is, the category A includes the wafers each exhibiting the element map #1 at the degree of appearance smaller than T1, and the element map #2 at the degree of appearance smaller than T2. The category B includes the wafers each exhibiting the element map #1 at the degree of appearance smaller than T1, and the element map #2 at the degree of appearance larger than T2. The category C includes the wafers each exhibiting the element map #1 at the degree of appearance larger than T1 and the element map #2 at the degree of appearance smaller than T2. The category D includes the wafers each exhibiting the element map #1 at the degree of appearance larger than T1 and the element map #2 at the degree of appearance larger than T2. The wafers each exhibiting the element maps at the degree of appearance equal to the threshold value T1 or T2 may be classified into one of the two categories including the threshold value as a boundary. The number of wafers classified into a category X (where X is any of A to D) is referred to as NX.

Accuracy can be expressed by, for example, (NA+ND)/ (NA+NB+NC+ND). With the degree of association set to the accuracy, the association calculator 23 can calculate the accuracy by the above expression.

F-measure can be expressed by 2*Recall*Precision/(Recall+Precision) where Precision represents, for example, ND/(ND+NB), and Recall represents, for example, ND/ (ND+NC). With the degree of association set to the F-measure, the association calculator 23 calculates Precision and Recall to find the F-measure from the calculated Precision and Recall.

As for one or both of the two items of appearance information 400 to compare being categorical data, the association calculator 23 can calculate the numerical information accurately representing the level of co-occurrence relationship between the two element maps from the accuracy or the F-measure.

In the example above, the association calculator 23 compares the degrees of appearance with the threshold value T1 or T2 at the time of wafer classification. The association calculator 23 may classify the wafers depending on whether or not each degree of appearance is zero. For example, the factoring unit 22 can adjust the sparsity of factoring by setting the parameters of NMF. Thereby, the factoring unit 22 can obtain the degrees of appearance that contain as many zeros as possible as a result of the factoring. The association calculator 23 can calculate the value accurately representing the degree of association from the degrees of appearance that contains as many zeros as possible by the method of classifying wafers depending on whether or not the degree of appearance is zero.

Thus, various methods can be adopted as the method of calculating the degree of association. The association calculator 23 may receive the designation of a calculation method of the degree of association from an operator to calculate the degree of association by the designated calculation method. With the degree of association set to the accuracy or the F-measure, the association calculator 23 may receive the designation of the threshold values T1 and T2 from the operator.

The two items of appearance information 400 from which the degree of association is calculated can be optionally selected. As one example, the association calculator 23 can receive the designation of an element map to be a subject of analysis from one or more element maps calculated from one or more inspection result groups 200 of the product inspection. The designated element map is referred to as a target map. The association calculator 23 calculates the degree of association between the appearance information 400 of the target map and the appearance information 400 of another element map. The association calculator 23 sequentially selects one or more element maps calculated from the one or more inspection result groups 200 of the inspection in the manufacturing line and calculates the degree of association between the appearance information 400 of the selected element map and the target map. Calculating the degree of association between the appearance information 400 of a certain element map and another element map may be expressed as calculating the degree of association between a certain element map and another element map.

The output 24 outputs, to the display 15, a list containing a plurality of element maps in the order of the degree of association with the target map.

Figure 12:
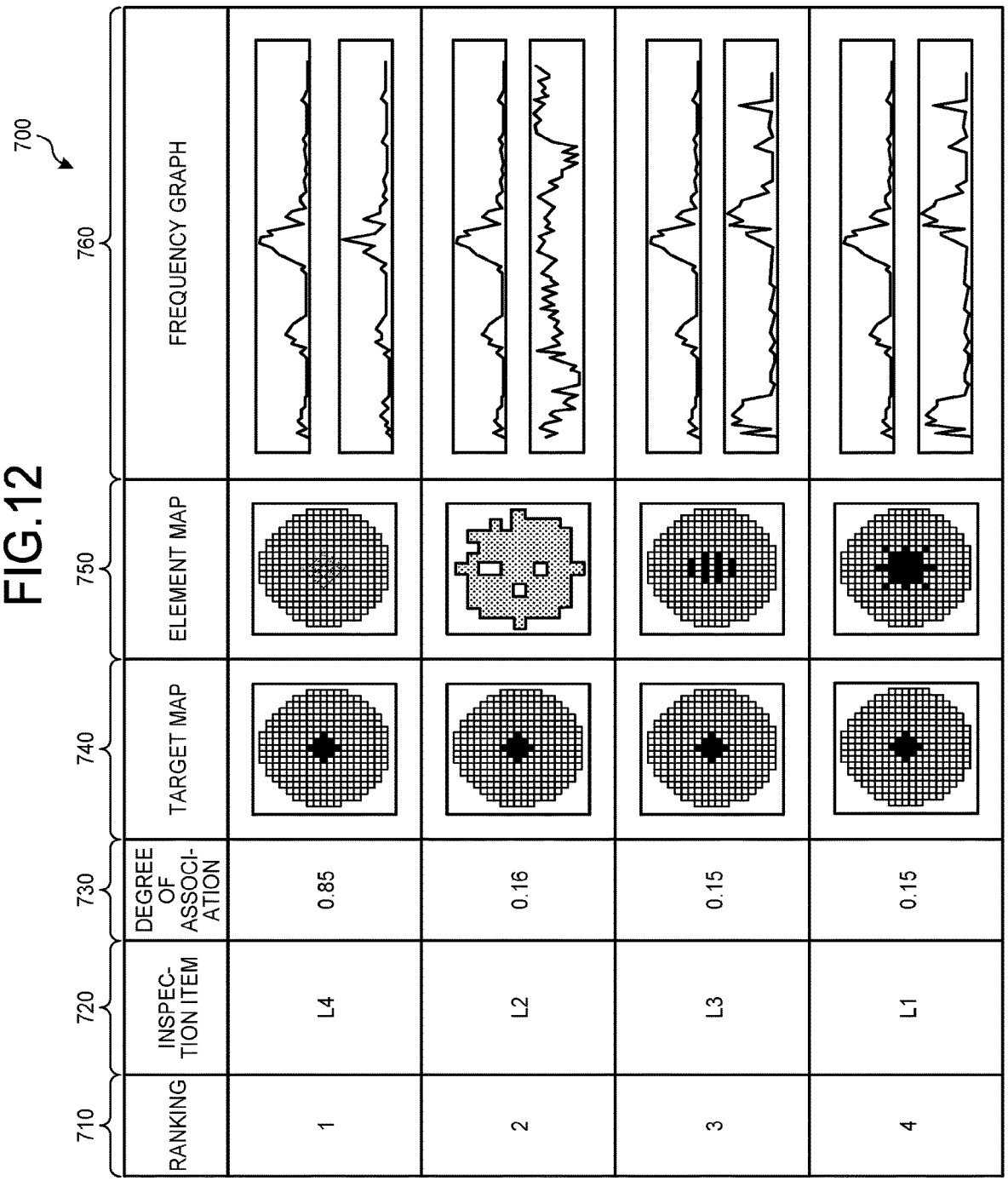
FIG. 12 is a schematic diagram illustrating an exemplary list output by the output in the first embodiment.

FIG. 12 is a schematic diagram illustrating an exemplary list to be output by the output 24 in the first embodiment. As illustrated in FIG. 12, the list to be output by the output 24 is in the form of a table. The table 700 includes a field 710, a field 720, a field 730, a field 740, a field 750, and a field 760. The field 710 displays ranking, the field 720 displays inspection items, the field 730 displays the degree of association, the field 740 displays graphical target maps, and the field 750 displays graphical element maps of which the degree of association with the target map is calculated, and the field 760 displays two items of appearance information 400 of two maps, that is, target map and element map.

In the field 760, a pair of graphs indicating the two items of appearance information 400 is displayed. The vertical axes of the graphs in the field 760 represent the degree of appearance and the horizontal axes represent the wafer ID, as one example. These graphs are referred to as appearance graphs. The two appearance graphs are vertically displayed side by side. The horizontal axes of the two appearance graphs are common to the target map and the element maps, and thus, their vertical arrangement allows the operator to visually understand the co-occurrence relationship between the features of the two maps qualitatively.

For example, regarding the inspection item L4, the degree of association between the target map and the element map is calculated as 0.85 being a considerably high value, and the two appearance graphs are similar in shape. That is, the operator can visually understand that the co-occurrence relationship that the wafer showing the feature of the target map shows the feature of the element map and the wafer showing no feature of the target map shows no feature of the element map feature, is established.

Regarding the inspection item L3, the degree of association between the target map and the element map is calculated as 0.15 being a low value, and thus the two appearance graphs are not similar in shape. That is, the operator can visually understand that the target map and the element map have substantially no co-occurrence relationship.

In the table 700, the element map with the highest degree of association is given a first rank, and records including inspection items, the degree of association, element maps, and pairs of appearance graphs are arranged in the order of the degree of association. This makes it possible to identify the inspection by which the element map co-occurring with the target map at a high level is found, and the fabrication process in which the inspection is conducted.

The table 700 is an exemplary list output by the output 24. The list output by the output 24 is not limited to the example illustrated in FIG. 12. Alternatively, the output 24 may output the list in the form of a file. The output 24 may transmit the list to an optional information processing device connected to the semiconductor process analysis device 1 via a network. In other words, the output destination of the list is not limited to the display 15.

Figure 13:
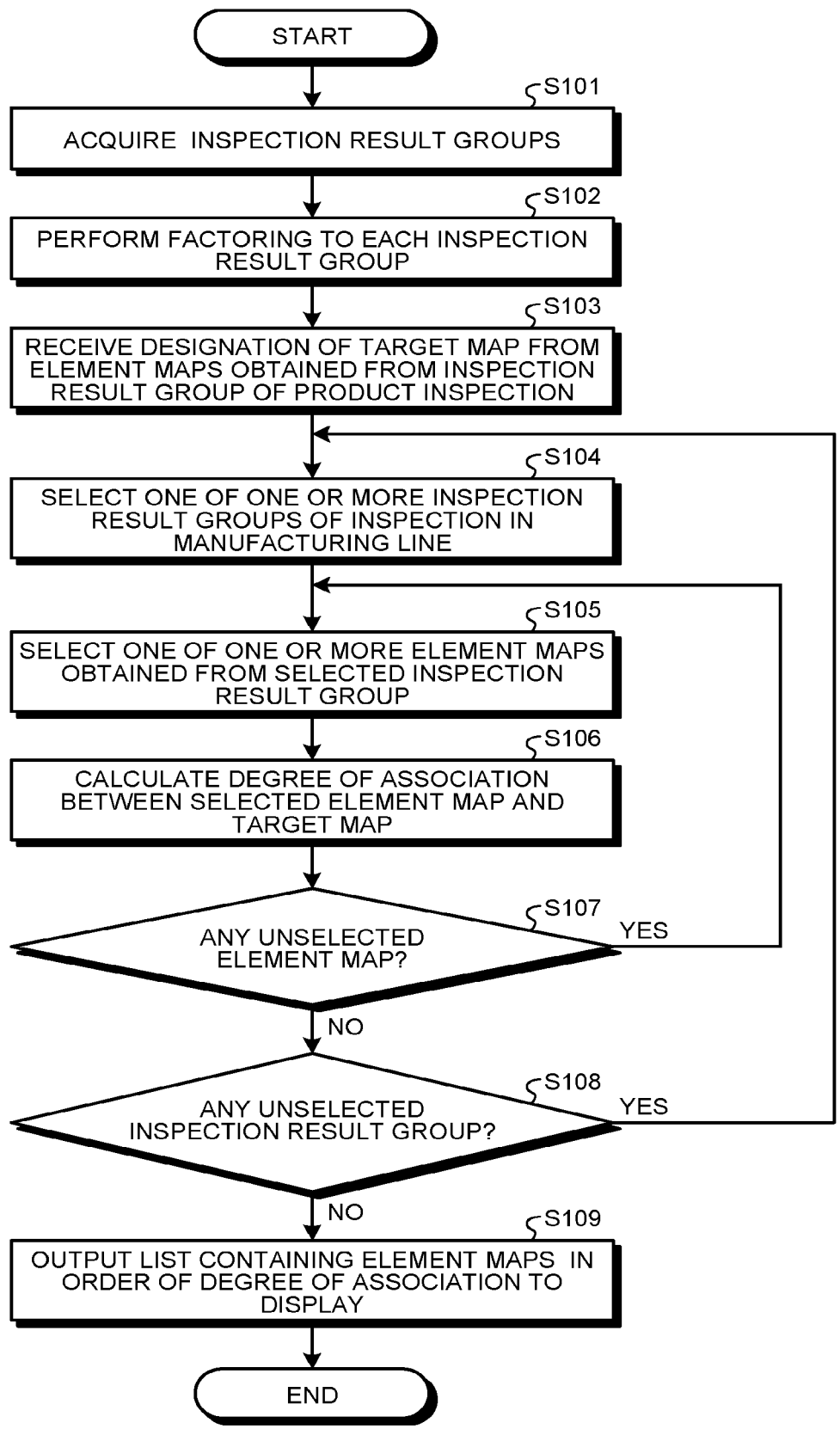
FIG. 13 is a flowchart illustrating an exemplary operation of the semiconductor process analysis device in the first embodiment.

FIG. 13 is a flowchart illustrating an exemplary operation of the semiconductor process analysis device 1 according to the first embodiment. First, the data acquirer 21 acquires two or more inspection result groups 200 (S101). The factoring unit 22 factorizes each of the inspection result groups 200 acquired by the data acquirer (S102). One or more element maps are obtained from each inspection result group 200 and stored in the RAM 11 in association with the inspection result group 200.

The association calculator 23 receives the designation of a target map (S103). For example, the output 24 may graphically displays, on the display 15, a part or all of the element maps of the inspection result groups 200 of the product inspections with item IDs Q1 to Qm, to prompt the operator to select one of the element maps on display.

In response to the designation of the target map, the association calculator 23 selects one of one or more inspection result groups 200 found by the inspection in the manufacturing line, for example, the number n of inspection result groups 200 of the inspection items L1 to Ln (S104). The association calculator 23 selects one of the one or more element maps, which are obtained by factoring the selected inspection result group 200 (S105). Then, the association calculator 23 calculates the degree of association between the selected element map and the target map (S106). The degree of association is exemplified by correlation coefficient.

Subsequently, the association calculator 23 determines whether or not any of the one or more element maps of the selected inspection result group 200 remains unselected (S107). With one or more unselected element maps found (YES in S107), the association calculator 23 returns to S105, and selects one of the one or more unselected element maps.

With no unselected element map found (NO in S107), the association calculator 23 determines whether any of the one or more inspection result groups 200, obtained by the inspection in the manufacturing line, remains unselected (S108). With one or more unselected inspection result groups 200 found (YES in S108), the association calculator 23 returns to S104 and selects one of the one or more unselected inspection result groups 200.

With no unselected inspection result group 200 found (No in S108), the output 24 outputs, to the display 15, the list containing the element maps in the order of the degree of association, that is, the table 700 illustrated in FIG. 12, for example (S109).

In S109, the semiconductor process analysis device 1 of the first embodiment ends the series of operations.

The first embodiment describes the example that the target map is designated from the element maps resulting from the inspection result group 200 of the product inspection. Alternatively, the target map may be designated from the element maps resulting from one or more inspection result groups 200 of the inspection in the manufacturing line. That is, the appearance information may be selected from each of the two inspection result groups 200 found in the manufacturing line, to calculate the degree of association between the selected items of appearance information.

The number of original maps constituting each inspection result group 200 can be set optionally. The number of original maps constituting each inspection result group 200 affects the accuracy at which two features co-occurring in two different inspection result groups 200 are identified. As the number of original maps of each inspection result group 200 increases, the accuracy improves. The operator can set the number of original maps of each inspection result group 200 according to desired accuracy. As one example, by constituting one inspection result group 200 of 25 original maps, it is made possible to properly, accurately identify two features co-occurring in two different inspection result groups 200.

As described above, according to the first embodiment, the semiconductor process analysis device 1 includes the factoring unit 22 and the association calculator 23. The factoring unit 22 performs factoring to the inspection result groups 200 found through the inspections of the wafer group. Each inspection result group 200 includes a group of original maps of each wafer of the wafer group acquired by a single inspection. Each original map represents a distribution of inspection data on the wafer surface. The factoring serves as a process of calculating, from the group of original maps, for each element map, the appearance information 400 including a degree of appearance of one or more element maps in each wafer. The association calculator 23 calculates the degree of association between two items of appearance information 400 calculated from different inspection result groups 200.

Thereby, the semiconductor process analysis device 1 can evaluate the association among the inspection result groups 200 resulting from the inspections with different inspection specifications.

According to the first embodiment, the semiconductor process analysis device 1 further includes the output 24. In response to designation of the target map, the association calculator 23 calculates the degree of association between the target map and each of the element maps calculated from the inspection result groups 200. The output 24 outputs the list containing the element maps in the order of the degree of association, for example, the table 700 illustrated in FIG. 12.

Thereby, the semiconductor process analysis device 1 can identify the inspection by which the element maps co-occurring with the target map at a higher level are found, and the fabrication process in which the inspection is conducted.

The output 24 displays the above list on the display 15 and displays the appearance graphs indicating the appearance information 400 of the target map and the element maps, in association with the element maps.

This enables the operator to visually and qualitatively understand the co-occurrence relationship between the features represented by the target map and the element maps.

The factoring unit 22 performs factoring by NMF.

Thereby, the semiconductor process analysis device 1 can collectively calculate one or more element maps and the appearance information of each element map.

As described above, the algorithm used in the factoring is not limited to NMF.

Second Embodiment

A single fabrication device may not perform a single fabrication process to a wafer group. Different fabrication devices may individually perform a fabrication process to one or more wafers of the wafer group. Due to the differences in condition of the fabrication devices, the wafers may exhibit different features depending on the fabrication devices.

Thus, in the second embodiment, the degrees of association are individually calculated for the fabrication devices. For this purpose, a semiconductor process analysis device 1a of the second embodiment stores fabrication-device information indicating the fabrication devices that fabricate respective wafers, in a given memory, e.g., the RAM 11, the ROM 12, or the storage 13.

Figure 14:
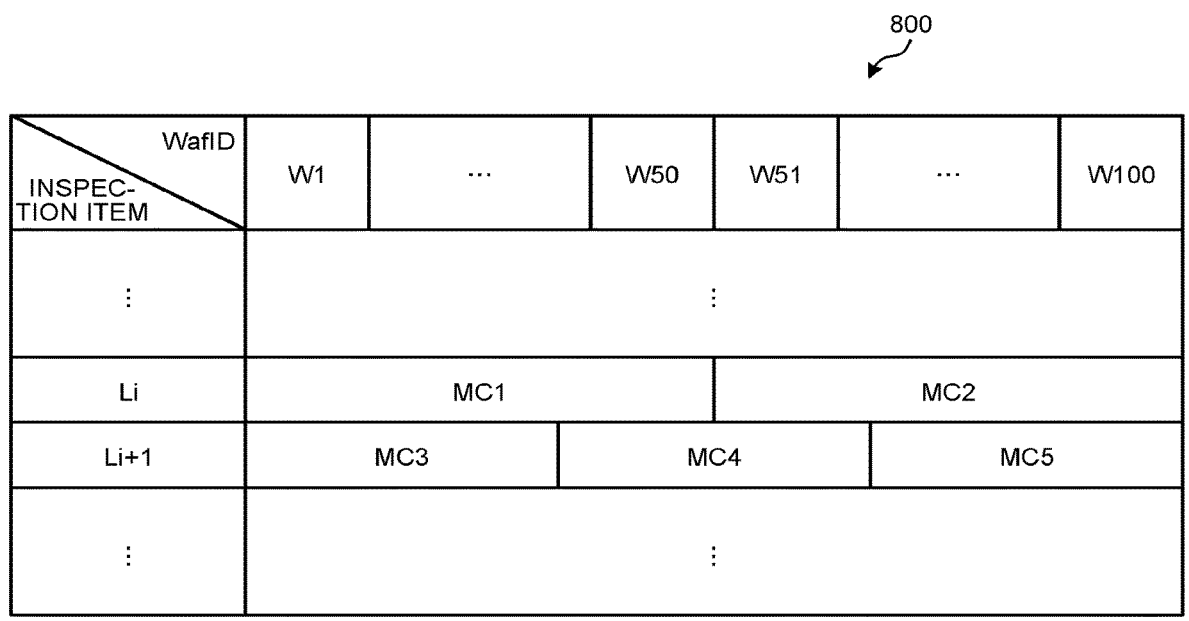
FIG. 14 is a schematic diagram illustrating exemplary fabrication-device information according to the second embodiment.

FIG. 14 is a schematic diagram illustrating an exemplary fabrication-device information 800 according to the second embodiment. The fabrication-device information 800 illustrated in FIG. 14 contains records of identification information of the fabrication devices, having fabricated the wafers, for each inspection item of the inspection conducted in the manufacturing line. It can be seen from the fabrication-device information 800, for example, that in the fabrication process in which the inspection of the item Li (i is an integer of one or more and n−1 or less) is conducted, the wafers W1 to W50 are fabricated by a fabrication device MC1, and the wafers W51 to W100 are fabricated by a fabrication device MC2. It can be also seen that in the fabrication process in which the inspection of the item Li+1 is conducted, 100 wafers are fabricated by any of three fabrication devices MC3, MC4, and MC5.

The association calculator 23 can individually identify the fabrication devices having fabricated the wafers, with reference to the fabrication-device information 800.

Figure 15:
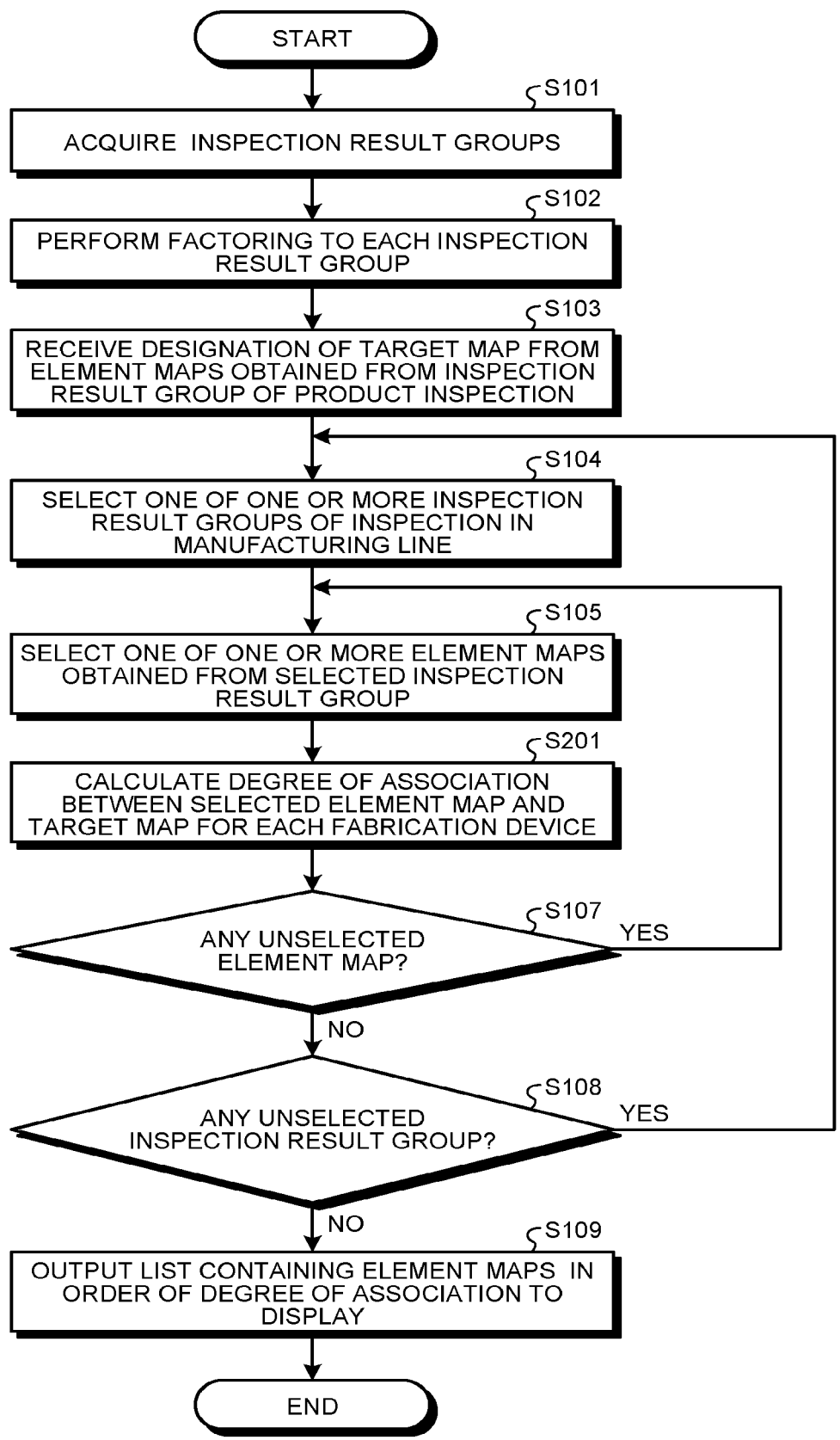
FIG. 15 is a flowchart illustrating an exemplary operation of a semiconductor process analysis device according to the second embodiment.

FIG. 15 is a flowchart illustrating an exemplary operation of the semiconductor process analysis device 1a according to the second embodiment. The operation of the semiconductor process analysis device 1a of the second embodiment is different from the series of operations of the first embodiment illustrated in FIG. 13 in that the operation in S106 is replaced by the operation in S201. The following will describe only the operation in S201 and omit describing the rest of the operations.

In S201, the association calculator 23 calculates the degree of association between the element map selected in S105 and the target map for each fabrication device.

For example, assumed that the element map is selected from the inspection result groups 200 of the inspection item Li in S105. With reference to the fabrication-device information 800, the association calculator 23 identifies the fact that the wafers W1 to W50 are fabricated by the fabrication device MC1, and the wafers W51 to W100 are fabricated by the fabrication device MC2 in the fabrication process in which the inspection of the item Li is conducted.

The association calculator 23 divides the appearance information on each of the element map and the target map into first element appearance information as to the wafers W1 to W50 and second element appearance information as to the wafers W51 to W100.

In the example of FIG. 9, the association calculator 23 extracts, as the first element appearance information, the first half, i.e., 50 elements with the wafer IDs W1 to W50 from among the 100 elements included in the appearance information 400. The association calculator 23 extracts, as the second element appearance information, the second half, i.e., 50 elements with the wafer IDs W51 to W100 from among the 100 elements included in the appearance information 400. The association calculator 23 extracts the first element appearance information and the second element appearance information from both of the appearance information 400 on the target map and the appearance information 400 on the element map.

Subsequently, the association calculator 23 calculates the degree of association between the first element appearance information as the degree of association for the fabrication device MC1. The association calculator 23 calculates the degree of association between the second element appearance information as the degree of association for the fabrication device MC2. This completes the calculation of the degree of association for each fabrication device.

As for the element map selected from the inspection result group 200 of the inspection item Li+1, the association calculator 23 extracts the element appearance information on the wafer fabricated by the fabrication device MC3, the element appearance information on the wafer fabricated by the fabrication device MC4, and the element appearance information on the wafer fabricated by the fabrication device MC5 from both of the appearance information 400 on the target map and the appearance information 400 on the element map, as described above. Then, the association calculator 23 individually calculates the degrees of association between the element appearance information on the target map and the extracted items of element appearance information. Thus, the association calculator 23 can calculate the degree of association for each fabrication device from the element maps selected from the inspection result group 200 of the inspection item Li+1.

If the association calculator 23 calculates a plurality of degrees of association concerning different fabrication devices from one element map, the output 24 regards the degrees of association as different items and calculates ranking. That is, the output 24 records the degrees of association in the table 700 as different items. The ID numbers of the fabrication devices may be displayed in association with the records.

For example, the output 24 may output the degree of association with a higher rank between the element map representing the feature determined as an inferior quality and the element map appearing in the result of the inspection of the wafer group fabricated by a certain fabrication device. In such a case, a failure in condition of the certain fabrication device may be occurring. The operator can identify the fabrication device having the failure in condition from the degree of association calculated for the fabrication devices.

Thus, according to the second embodiment, the association calculator 23 individually calculates the degrees of association for the fabrication devices.

Thereby, the semiconductor process analysis device 1a can identify the failure in condition of the fabrication devices.

Third Embodiment

The first and second embodiments has described the example of calculating the degree of association between two items of appearance information. Alternatively, the degree of association between the appearance information and information other than the appearance information may be calculated. A third embodiment will describe an example of calculating the degrees of association between the appearance information and device parameters. The third embodiment can be combined with both the first embodiment and the second embodiment.

The device parameters refer to data associated with the fabrication processes and recorded by the fabrication devices in the fabrication processes. Specifically, the device parameters are parameters to measure such as processing temperature and processing time. Each fabrication device includes a measuring device such as a temperature sensor and a time counter and records a measured value by the measuring device. The fabrication device acquires a measured value of each wafer and records the value in association with the wafer.

In this disclosure, the device parameter represents a set of measured values of N wafers. One device parameter or two or more device parameters may be obtained from one fabrication process. The device parameters are not limited to such an example.

As described above, the device parameter is a set of N items of numerical information. The N items of numerical information correspond to the N wafers one by one. The device parameter are thus directly comparable with the appearance information.

In the third embodiment, the association calculator 23 calculates the degree of association between the appearance information and the device parameter. For example, due to occurrence of an inferior quality resulting from an anomaly in a certain device parameter, a co-occurrence relationship may be observed between the appearance information of the element map corresponding to the inferior quality and the device parameter. The operator can use the degree of association between the appearance information and the device parameter for reviewing the setting parameter for the fabrication process.

The third embodiment will be now described in detail. The third embodiment will describe the different features from those of the first and second embodiments, and briefly describe or omit the same features as those of the first or second embodiment. The semiconductor process analysis device of the third embodiment is denoted by the reference numeral 1b.

A semiconductor process analysis device 1b has the same hardware configuration as the semiconductor process analysis device 1 of the first embodiment. However, the semiconductor process analysis device 1b differs from the semiconductor process analysis device 1 of the first embodiment in that the storage 13 pre-stores different information.

Figures 17, 18:
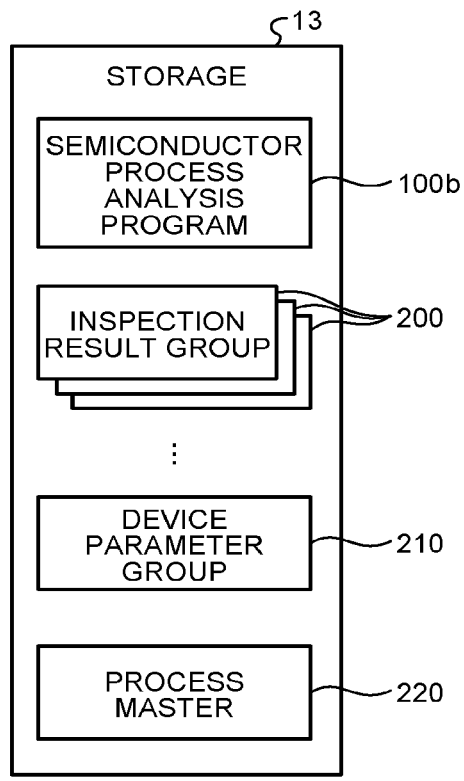
FIG. 17 is a schematic diagram illustrating information stored in a storage of a semiconductor process analysis device according to the third embodiment.
FIG. 18 is a diagram illustrating an exemplary data structure of a process master in the third embodiment.

FIG. 17 is a schematic diagram illustrating the information stored in the storage 13 of the semiconductor process analysis device 1b according to the third embodiment. As illustrated in FIG. 17, the semiconductor process analysis device 1b stores in advance a semiconductor process analysis program 100b, inspection result groups 200, a device parameter group 210, and a process master 220 in the storage 13.

The semiconductor process analysis program 100b is a computer program serving to implement the function of the semiconductor process analysis device 1b. The CPU 10 implements the function of the semiconductor process analysis device 1b by executing the semiconductor process analysis program 100b.

The device parameter group 210 represents a set of data including the device parameters for all the fabrication processes. Each device parameter of the device parameter group 210 is associated with the fabrication process in which the device parameter is recorded.

The process master 220 represents information containing the records of the correspondence between the inspections and the fabrication process groups.

FIG. 18 is a diagram illustrating an exemplary data structure of the process master 220 according to the third embodiment. In the example of FIG. 18, the process master 220 has a data structure in a table format in which the inspection items are registered in association with the fabrication processes. One inspection may be associated with one fabrication process or two or more fabrication processes. The fabrication process group refers to one or more fabrication processes associated with one inspection.

For example, all the fabrication processes performed between the inspection of a certain item Li and the inspection of an item L(i+1) following the item Li are associated with the inspection of the item L(i+1).

In the example of FIG. 18, the fabrication process P1 is performed before the initial inspection of the item L1. Thus, in the row of the process master 220 a record of the correspondence between the inspection item L1 and the fabrication process P1 is registered. Further, the fabrication process P2, the fabrication process P3, and the fabrication process P4 are performed between the inspection of the item L1 and the inspection of the item L2. Thus, in the second row of the process master 220 a record of the correspondence between the inspection item L2 and the fabrication processes P2 to P4 is registered.

The method of association as above is merely exemplary. For example, the inspection of the item L(i+1) may be associated with a fabrication process other than the fabrication process performed between the inspection of the item Li and the inspection of the item L(i+1). Further, the data structure of the process master 220 is not limited to the one illustrated in FIG. 18.

Figure 19:
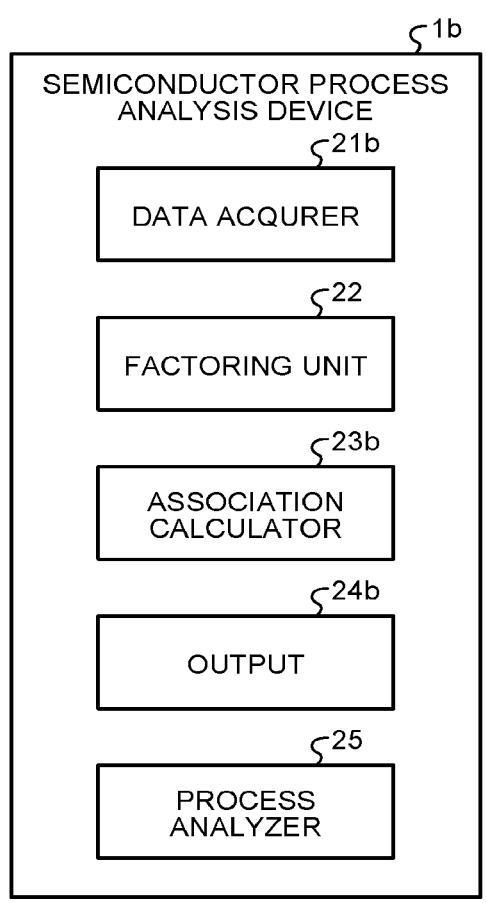
FIG. 19 is a schematic diagram illustrating an exemplary functional configuration of the semiconductor process analysis device of the third embodiment.

FIG. 19 is a schematic diagram illustrating an exemplary functional configuration of the semiconductor process analysis device 1b according to the third embodiment. As illustrated in FIG. 19, the semiconductor process analysis device 1b includes a data acquirer 21b, a factoring unit 22, an association calculator 23b, an output 24b, and a process analyzer 25. The functions of the data acquirer 21b, the factoring unit 22, the association calculator 23b, the output 24b, and the process analyzer 25 are implemented, for example, by the CPU 10's executing the semiconductor process analysis program 100b.

The data acquirer 21b can acquire the device parameter from the device parameter group 210 stored in the storage 13 in addition to the operation of the data acquirer 21 of the first embodiment. At the time of acquiring the device parameter, the data acquirer 21b sets measured values constituting the device parameter in the order of the wafer ID.

As with the association calculator 23 of the first embodiment, the association calculator 23b calculates the degree of association between two items of appearance information calculated from different inspection result groups 200. Further, the association calculator 23b calculates the degree of association between the appearance information and the device parameter. The degree of association between the appearance information and the device parameter can be a correlation coefficient, a cosine similarity, a Euclidean distance, a KL divergence, an accuracy, or an F-measure, or can be an evaluation index other than these parameters.

As one example, the association calculator 23b calculates the degree of association between the appearance information of the target map and the device parameter. The subject of calculation of the degree of association with the device parameter is not limited to the appearance information of the target map. The association calculator 23b may be configured to calculate the degree of association between the appearance information of an optional element map and the device parameter.

The process analyzer 25 controls the association calculator 23b to calculate the degree of association between one item of appearance information and the device parameter. The function of the process analyzer 25 will be described in detail in connection with the operation.

As with the output 24 of the first embodiment, the output 24b outputs, to the display 15, the list containing, in the order of the degree of association, the element maps of which the degrees of association with the target map are calculated. The output 24b can output, to the display 15, a second list containing, in the order of the degree of association, one or more device parameters of which the degrees of association with the appearance information of the target map are calculated.

Figure 20:
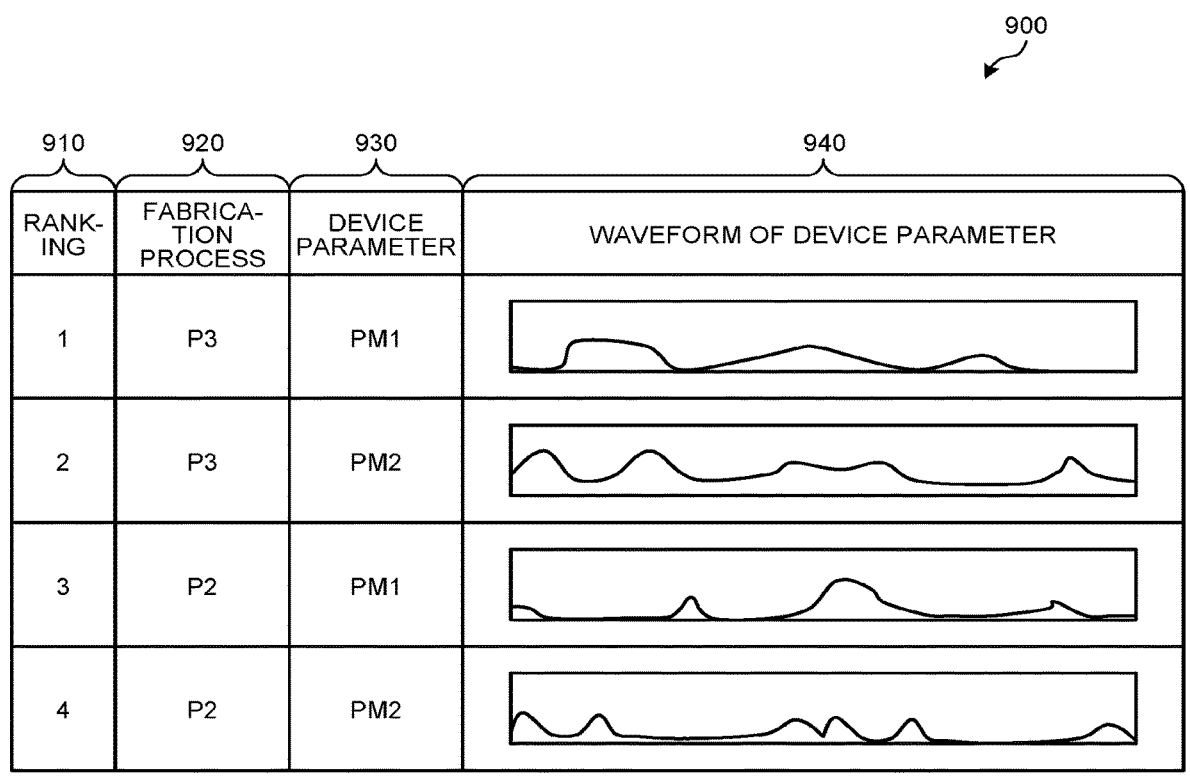
FIG. 20 is a schematic diagram illustrating an exemplary second list output by the output of the third embodiment.

FIG. 20 is a schematic diagram illustrating an exemplary second list to be output by the output 24b in the third embodiment. As illustrated in FIG. 20, the second list to be output by the output 24b is in the form of a table. The table 900 includes a field 910 for displaying a ranking, a field 920 for displaying fabrication processes, a field 930 for displaying device parameters, and a field 940 for graphically displaying the details of device parameters.

In the table 900, the device parameter having the highest degree of association with the appearance information of the target map is given a first rank, and the records including the names of the fabrication processes, the names of the device parameters, and the details of the device parameters are set in the order of the degree of association. Thereby, the operator can identify the device parameter having a co-occurrence relationship at a high level with the event indicated by the element map, and thus the operator can identify the fabrication process in which the device parameter is recorded.

In the field 940, the details of the device parameters, specifically, N measured values of each device parameter are displayed in the form of a graph. The vertical axis of the graph represents the measured values and the horizontal axis represents the wafer IDs. This graph is referred to as waveform of the device parameter. From the waveform of the device parameter on display in the field 940, the operator can visually and qualitatively understand variation in the value of the device parameter for each wafer.

The table 900 is an exemplary second list output by the output 24b. The second list output by the output 24 is not limited to the example illustrated in FIG. 20. Further, the output 24b may output the second list in the form of a file. The output 24b may transmit the second list to an optional information processing device connected to the semiconductor process analysis device 1b via a network. That is, the output destination of the second list is not limited to the display 15.

Figure 21:
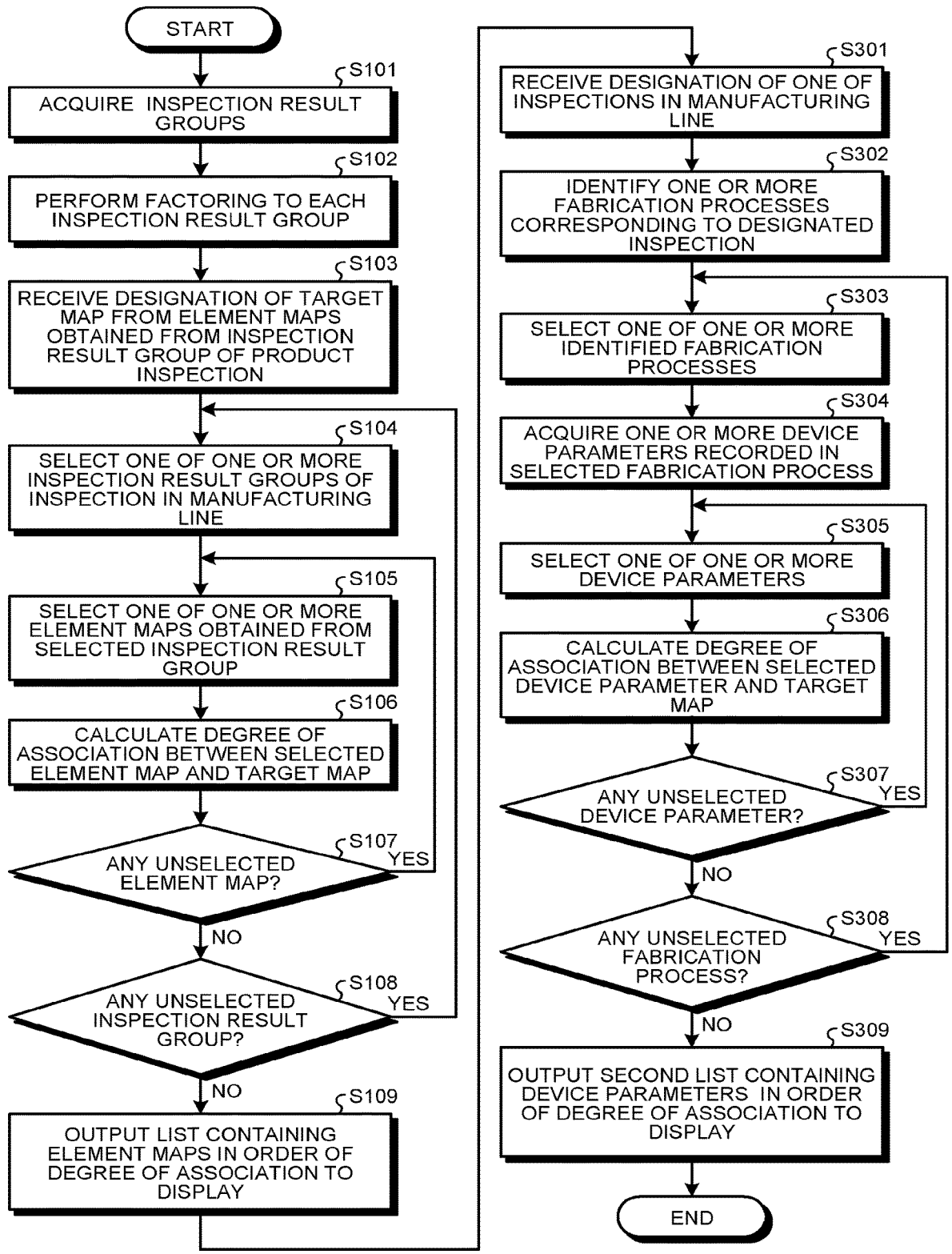
FIG. 21 is a flowchart illustrating an exemplary operation of the semiconductor process analysis device of the third embodiment.

FIG. 21 is a flowchart illustrating an exemplary operation of the semiconductor process analysis device 1b according to the third embodiment.

In S101 to S109, the semiconductor process analysis device 1b performs the same operations as the semiconductor process analysis device 1 of the first embodiment.

After S109, the process analyzer 25 receives designation of one of the inspections in the manufacturing line through the list output to the display 15 (S301).

For example, the operator can enter a selection of one of the one or more records in the table 700. The process analyzer 25 acquires an inspection item included in the selected record as a designated inspection.

The method of designating an inspection is not limited thereto. The process analyzer 25 can receive the designation of an inspection by an optional method.

Subsequent to S301, the process analyzer 25 identifies one or more fabrication processes corresponding to the designated inspection with reference to the process master 220 (S302).

The process analyzer 25 selects one of the one or more identified fabrication processes (S303). The process analyzer 25 then controls the data acquirer 21b to acquire, from the device parameter group 210, one or more device parameters recorded in the selected fabrication process (S304).

The process analyzer 25 selects one of the one or more acquired device parameters (S305).

Subsequently, the association calculator 23b calculates the degree of association between the selected device parameter and the target map (S306).

The process analyzer 25 determines whether or not any of the one or more acquired device parameters remains unselected (S307). With one or more unselected device parameters found (YES in S307), the process analyzer 25 returns to S305, and selects one of the one or more unselected device parameters.

With no unselected device parameter found (No in S307), the process analyzer 25 determines whether or not any of the one or more identified fabrication processes remains unselected (S308). With one or more unselected fabrication processes found (YES in S308), the process analyzer 25 returns to S303, and selects one of the one or more unselected fabrication processes.

With no unselected fabrication process found (No in S308), the output 24b outputs, to the display 15, the second list containing the device parameters in the order of the degree of association, that is, the table 900 illustrated in FIG. 20, for example (S309).

In S309, the semiconductor process analysis device 1b of the third embodiment ends the series of operations.

The third embodiment describes the example of setting the appearance information of the target map to a subject of the calculation of the degree of association with each device parameter. The appearance information being a subject of the calculation of the degree of association with each device parameter is not limited to such an example. The association calculator 23b can calculate the degree of association between the appearance information of the element map selected by an optional method and the device parameter selected by an optional method.

In the third embodiment the device parameters are defined as parameters to measure of such as processing temperature and processing time. The device parameters may be setting parameters of such as processing temperature and processing time.

As described above, according to the third embodiment, the association calculator 23b calculates the degree of association between one item of appearance information, calculated from one of the inspection result groups, and one device parameter including numerical information of each substrate, recorded in a fabrication process.

Thereby, the operator can utilize the degree of association between the appearance information and the device parameter for reviewing the setting parameters in the fabrication process.

According to the third embodiment, the process master 220 serves to associate each inspection with one or more fabrication processes. In response to designation of an inspection, the association calculator 23b calculates, under the control of the process analyzer 25, the degree of association between the appearance information of a certain element map, e.g., the target map, and each of one or more device parameters recorded in one or more fabrication processes associated with one designated inspection. The output 24b outputs the second list containing one or more device parameters in the order of the degree of association.

Thereby, the operator can identify the device parameter having a higher-level co-occurrence relationship with the element map.

According to the third embodiment, the output 24b displays the one or more device parameters in the form of a graph on the display 15.

Thereby, the operator can visually and qualitatively understand the variation in the value of the device parameter for each wafer.

Fourth Embodiment

There are single-wafer processing fabrication devices with a multi-chamber structure, including two or more chambers. Such a fabrication device sequentially distributes the number N of wafers to two or more chambers, and subjects the wafers to the same operation in the chambers at the same time. The concurrent single-wafer processing in the multiple chambers can shorten the processing time.

An anomaly in a certain chamber of such a fabrication device, if it occurs, may cause occurrence of periodicity in the appearance information of a certain element map.

Figure 22:
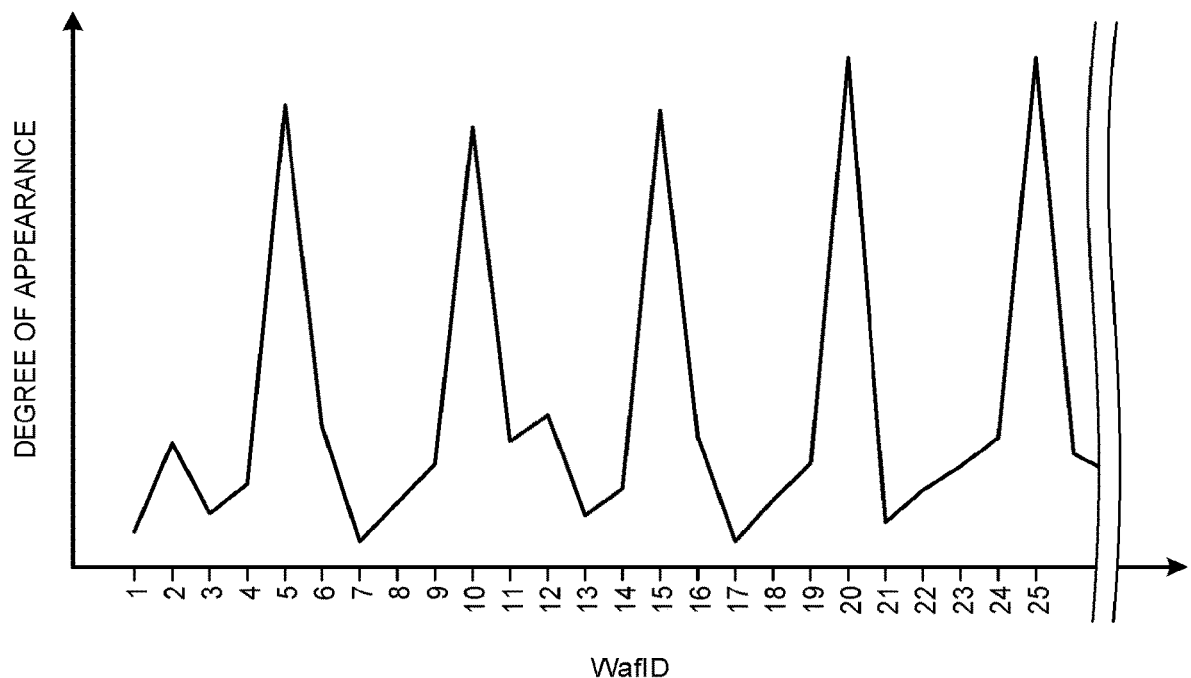
FIG. 22 is a diagram illustrating an exemplary appearance information of a certain element map according to a fourth embodiment.

FIG. 22 is a diagram illustrating an example of appearance information of a certain element map in a fourth embodiment. FIG. 22 illustrates the appearance information of a certain element map in the case of using a fabrication device including five chambers. It can be seen from the example of FIG. 22 that the wafers with the wafer IDs of multiples of five exhibit an extremely high degree of appearance. In other words, the appearance information shows a periodicity that every five wafers exhibit an extremely high degree of appearance. The extremely high degree of appearance of the wafers with the wafer IDs of multiples of five signifies that an anomaly occurs in one of the five chambers, in which the wafers with the wafer IDs of multiples of five are processed. Thus, in such a case, through analysis of variance (ANOVA) in units of a chamber, it is possible to detect the anomaly occurring in a particular chamber (in the above example, the chamber in which the wafers with the wafers ID of multiples of five are processed).

There are fabrication devices which perform batch processing to wafers in units of a lot. Occurrence of an anomaly in such a fabrication device may cause an increase in the degree of appearance of a certain element map in units of a lot. For example, when one lot includes 25 wafers, the appearance information of a certain element map may exhibit a peak of a width corresponding to 25 wafers. In such a case, by analysis of variance in units of a lot, it is possible to detect an anomaly occurring in a particular lot.

In the fourth embodiment, several conceivable features are associated with analysis algorithms. The analysis algorithm refers to an analysis method, an analysis condition, or both of them. The appearance information of the element map corresponding to any of the conceivable features can be analyzed by the corresponding analysis algorithm.

Hereinafter, several conceivable features are referred to as exemplary features.

One of the several exemplary features is such that the appearance information exhibits a periodicity, as an example. This exemplary feature is referred to as a first exemplary feature. The first exemplary feature is associated with the analysis algorithm that the N wafers are classified by phase in the cycle of the degrees of appearance, to perform the analysis of variance to the classified wafer groups. This makes it possible to detect an anomaly, if it occurs, in a certain chamber of the fabrication device including multiple chambers through the analysis of variance in units of a chamber, for example.

Another one of the several exemplary features is such that the appearance information exhibits a variation in units of a lot, as an example. This exemplary feature is referred to as a second exemplary feature. The second exemplary feature is associated with the analysis algorithm that the N wafers are classified by lot, to perform the analysis of variance to the classified wafer groups. It is made possible to detect an anomaly occurring in a particular lot by this analysis algorithm.

The pair of the exemplary feature and the corresponding analysis algorithm is not limited to the above example.

Hereinafter, the fourth embodiment will be described in detail. The fourth embodiment will describe the differences from the first to third embodiments and briefly describe or omit the same features as those of the first to third embodiments. The semiconductor process analysis device of the fourth embodiment is denoted by the reference numeral $1c$. The fourth embodiment can be combined with any of the first embodiment, the second embodiment, and the third embodiment.

A semiconductor process analysis device $1c$ has the same hardware configuration as the semiconductor process analysis device 1 of the first embodiment. However, the semiconductor process analysis device $1c$ differs from the semiconductor process analysis device 1 of the first embodiment in that the storage 13 pre-stores different information.

Figure 23:
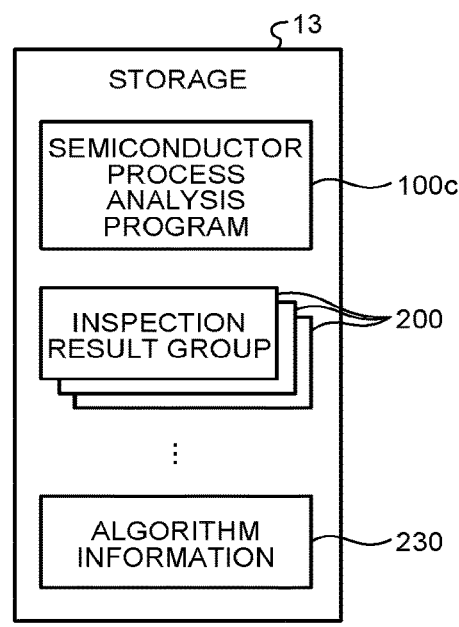
FIG. 23 is a schematic diagram illustrating information stored in a storage of a semiconductor process analysis device of the fourth embodiment.

FIG. 23 is a schematic diagram illustrating information stored in the storage 13 of the semiconductor process analysis device $1c$ of the fourth embodiment. As illustrated in FIG. 23, in the semiconductor process analysis device $1c$, the storage $13a$ pre-stores a semiconductor process analysis program $100c$, inspection result groups 200, and algorithm information 230.

The semiconductor process analysis program $100c$ is a computer program serving to implement the function of the semiconductor process analysis device $1c$. The CPU 10 implements the function of the semiconductor process analysis device $1c$ by executing the semiconductor process analysis program $100c$.

The algorithm information 230 contains analysis algorithm or algorithms in association with one or more exemplary features.

Figure 24:
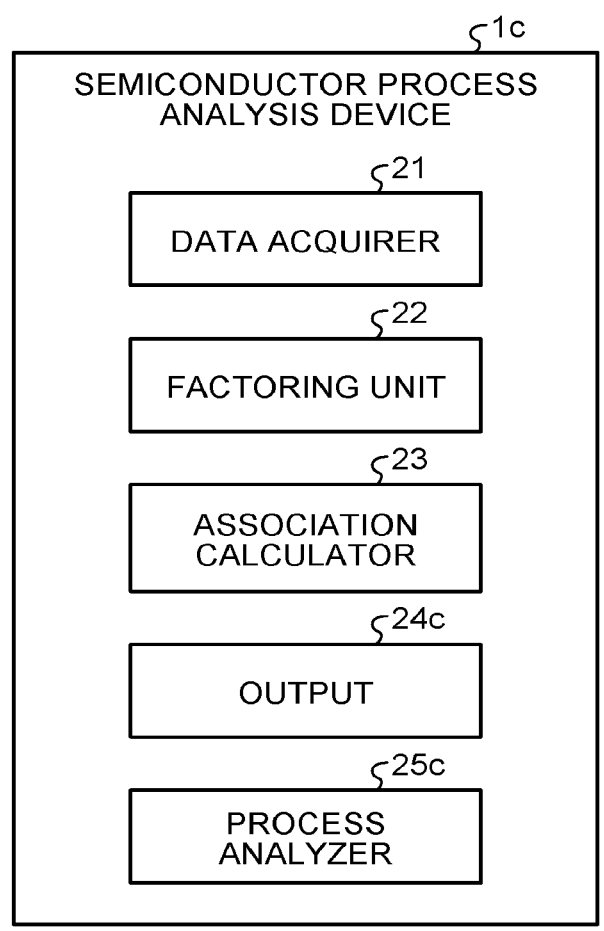
FIG. 24 is a schematic diagram illustrating an exemplary functional configuration of the semiconductor process analysis device of the fourth embodiment.

FIG. 24 is a schematic diagram illustrating an exemplary functional configuration of the semiconductor process analysis device $1c$ of the fourth embodiment. As illustrated in FIG. 24, the semiconductor process analysis device $1c$ includes a data acquirer 21, a factoring unit 22, an association calculator 23, an output $24c$, and a process analyzer $25c$. The functions of the data acquirer 21, the factoring unit 22, the association calculator 23, the output $24c$, and the process analyzer $25c$ are implemented, for example, by the CPU 10's executing the semiconductor process analysis program $100c$.

The process analyzer $25c$ serves to identify an exemplary feature similar to the feature of the appearance information of one element map from one or more exemplary features. The process analyzer $25c$ analyzes the appearance information of the element map by an analysis method and an analysis condition corresponding to the identified exemplary feature.

As with the output 24 of the first embodiment, the output $24c$ outputs, to the display 15, the list containing the element maps, whose degrees of association with the target map are calculated, in the order of the degrees of association. Further, the output $24c$ can output the result of the analysis by the process analyzer $25c$ to the display 15.

Figure 25:
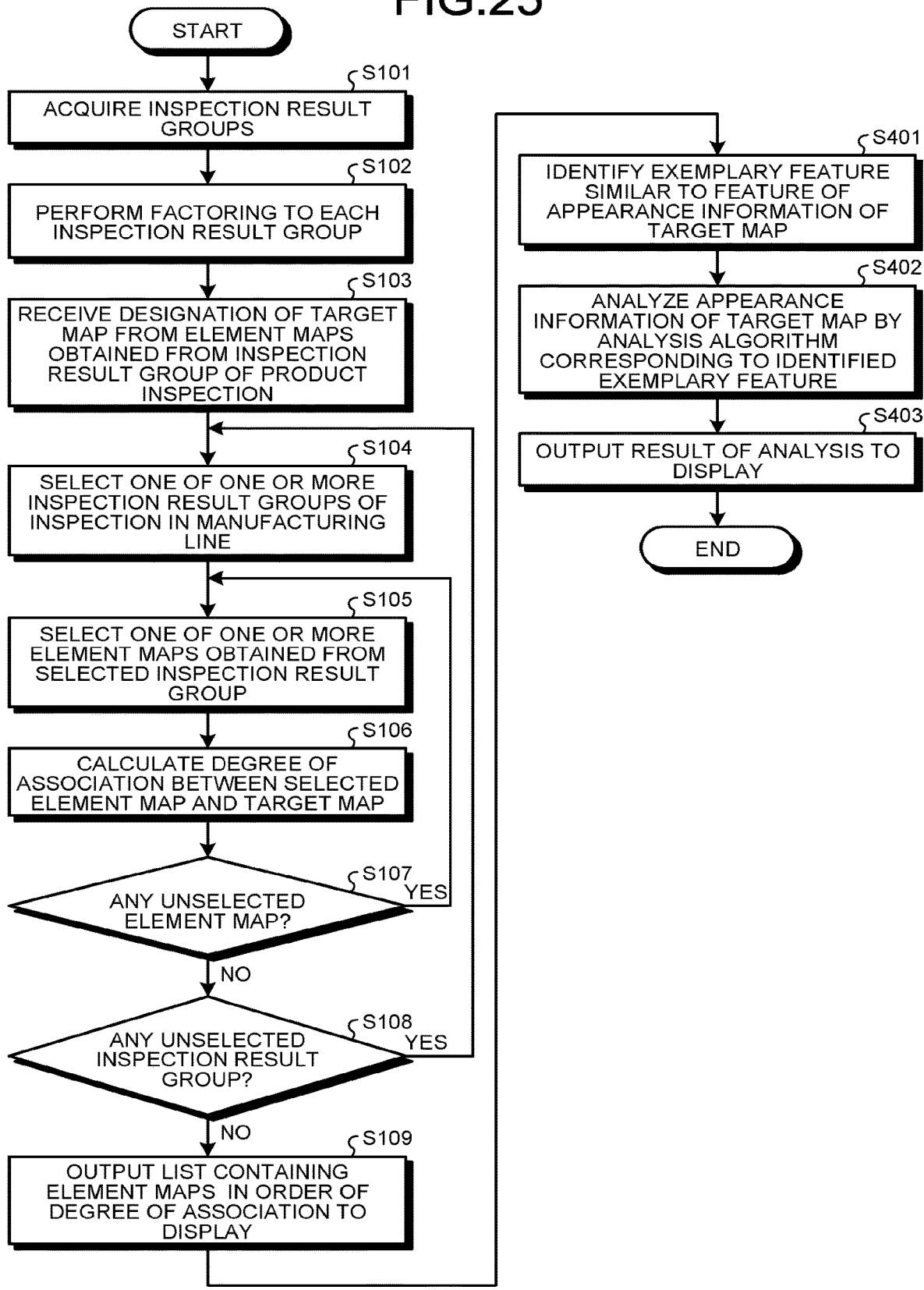
FIG. 25 is a flowchart illustrating an exemplary operation of the semiconductor process analysis device in the fourth embodiment.

FIG. 25 is a flowchart illustrating an exemplary operation of the semiconductor process analysis device $1c$ according to the fourth embodiment.

In S101 to S109, the semiconductor process analysis device $1c$ performs the same operations as the semiconductor process analysis device 1 of the first embodiment.

After S109, the process analyzer $25c$ identifies an exemplary feature similar to the feature of the appearance information of the target map from among the one or more exemplary features (S401).

The identifying method of the exemplary feature can be optionally defined. For example, the process analyzer $25c$ performs frequency analysis of the appearance information of the target map to determine whether or not the appearance information of the target map has a periodicity. With a periodicity of the appearance information of the target map found, the process analyzer $25c$ determines that the appearance information of the target map has a feature similar to that of the first exemplary feature. With no periodicity of the appearance information of the target map found, the process analyzer $25c$ determines that the appearance information of the target map has no feature similar to that of the first exemplary feature.

As another example, the process analyzer $25c$ determines whether or not the degrees of appearance constituting the appearance information of the target map varies in units of a lot. For example, if the appearance information of the target map exhibits a peak of a width corresponding to the number of wafers serving as a lot, the process analyzer $25c$ can determines that the degrees of appearance in the appearance information of the target map varies in units of a lot. From the variation in the degrees of appearance in units of a lot, the process analyzer $25c$ determines that the appearance information of the target map has a feature similar to that of the second exemplary feature. From no variation in the degrees of appearance in units of a lot, the process analyzer $25c$ determines that the appearance information of the target map has no feature similar to that of the second exemplary feature.

Thus, the process analyzer $25c$ can identify an exemplary feature similar to the feature of the appearance information of the target map by determining similarity or non-similarity for each of the exemplary features.

Any exemplary feature similar to the feature of the appearance information of the target map may not be identified, or two or more exemplary features may be identified. When failing to identify an exemplary feature similar to the feature of the appearance information of the target map, the semiconductor process analysis device 1c of the fourth embodiment ends the operation in S401. After identifying two or more exemplary features, the semiconductor process analysis device 1c perform the subsequent operations to each identified exemplary feature. The following will describe an example that one exemplary feature is identified.

Subsequent to S401, the process analyzer 25c analyzes the appearance information of the target map by the analysis algorithm corresponding to the identified exemplary feature (S402).

Then, the output 24c outputs a result of the analysis in S402 to the display 15 (S403).

In S403, the semiconductor process analysis device 1c of the fourth embodiment completes a series of operations.

The fourth embodiment has described the example that the appearance information of the target map is subject to the analysis. The subject of the analysis is not limited to the target map.

For example, the operator can enter a selection of one of the one or more records contained in the table 700. The process analyzer 25c may receive the element map contained in the selected record to set the appearance information of the received element map as a subject of the analysis.

The process analyzer 25c may be configured to receive the designation of an element map other than the element maps included in the list output to the display 15. The process analyzer 25c may set all the element maps found by the factoring as subjects of the analysis. For example, the process analyzer 25c may select the element maps one at a time from all the element maps found by the factoring, and subject the appearance information of the selected element map to the operations in S401 to S403.

As described above, according to the fourth embodiment, the one or more exemplary features are individually associated with the analysis algorithms. The process analyzer 25c identifies an exemplary feature similar to the feature of the appearance information of one element map from among the one or more exemplary features. The process analyzer 25c analyzes the appearance information by the analysis algorithm associated with the identified exemplary feature. Thereby, the process analyzer 25c can analyze the element map according to the features of the appearance information.

The semiconductor process analysis programs 100, 100b, and 100c executed by the semiconductor process analysis devices 1, 1a, 1b, and 1c of the first to fourth embodiments may be pre-stored in the storage 13. The storage 13 represents an exemplary non-transitory tangible computer-readable storage medium. The semiconductor process analysis programs 100, 100b, and 100c may be recorded and provided in an installable or executable file format in a non-transitory, tangible computer-readable storage medium such as a compact disc-read only memory (CD-ROM), a flexible disc (FD), a CD-Recordable (R), a digital versatile disk (DVD), a universal serial bus (USB) memory, and a secure digital (SD) card.

The semiconductor process analysis programs 100, 100b, and 100c may be configured to be stored in a computer connected to a network such as the Internet and provided by being downloaded via the network. Further, the semiconductor process analysis programs 100, 100b, and 100c may be configured to be provided or distributed via a network such as the Internet.

The first to fourth embodiments have described the example that the CPU 10 serving as a processor executes the semiconductor process analysis programs 100, 100b, and 100c, so as to implement the functions of the data acquirers 21 and 21b, the factoring unit 22, the association calculators 23 and 23b, the outputs 24, 24b, and 24c, and the process analyzers 25 and 25c. The functions of the data acquirers 21 and 21b, the factoring unit 22, the association calculators 23 and 23b, the outputs 24, 24b, and 24c, and the process analyzers 25 and 25c may be partially or entirely implemented by logic circuitry. The functions of the data acquirers 21 and 21b, the factoring unit 22, the association calculators 23 and 23b, the outputs 24, 24b, and 24c, and the process analyzers 25 and 25c may be partially or entirely implemented by analog circuitry. The functions of the data acquirers 21 and 21b, the factoring unit 22, the association calculators 23 and 23b, the outputs 24, 24b, and 24c, and the process analyzers 25 and 25c may be partially or entirely implemented by a field-programmable gate array (FPGA) or an application specific integrated circuit (ASIC).

The first to fourth embodiments have described the example that the inspection result groups 200, the device parameter group 210, the process master 220, and the algorithm information 230 are stored in advance in the storage 13. The inspection result groups 200, the device parameter group 210, the process master 220, and the algorithm information 230 may be partially or entirely stored in an external device. The semiconductor process analysis programs 100, 100b, and 100c may be configured to acquire part or all of the inspection result groups 200, the device parameter group 210, the process master 220, and the algorithm information 230 from the external device.

According to the first to fourth embodiments as above, the semiconductor process analysis device can evaluate the association between the results of the inspections of which the inspection specifications are different.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor process analysis device comprising:
a memory; and
a processor connected to the memory, the processor configured to:
perform factoring to each of first distribution groups resulting from inspections of a group of substrates, the inspections including an inspection of a fabrication process of a semiconductor integrated circuit, the first distribution groups each resulting from a single inspection among the inspections, each of the first distribution groups including first distributions, each of the first distributions being a distribution of inspection data on a surface of a substrate among the substrates, the factoring including performing factorization of a first distribution group among the first distribution groups into a product of one or more second distributions and one or more appearance information sets to acquire the one or more second distributions and the one or more appearance information sets, the one or more appearance information sets each containing a degree of appearance of one of the one or more second distributions in each of the substrates, calculate a degree of association between two appearance information sets, the two appearance information sets respectively acquired from different first distribution groups among the first distribution groups, and control an operation of the fabrication process based on the degree of association calculated.

2. The semiconductor process analysis device according to claim 1, wherein the processor is further configured to:
receive designation of one of the one or more second distributions,
calculate the degree of association between a first appearance information set and each of second appearance information sets acquired by the factoring to each of the first distribution groups, the first appearance information set corresponding to the designated second distribution, and
output a list containing the second appearance information sets in the order of the degree of association.

3. The semiconductor process analysis device according to claim 2, wherein the processor is further configured to:
display the list on a display, and
display, on the display, a pair of a first graph and a second graph in association with one of the second appearance information sets, the first graph representing the first appearance information set, the second graph representing one of the second appearance information sets contained in the list.

4. The semiconductor process analysis device according to claim 1, wherein
the group of the substrates includes a first substrate group fabricated by a first fabrication device and a second substrate group fabricated by a second fabrication device different from the first fabrication device, and
the processor is configured to:
acquire, regarding each of the two appearance information sets, a first element appearance information set on the first substrate group and a second element appearance information set on the second substrate group, and
calculate a first degree of association between two of first element appearance information sets and a second degree of association between two of second element appearance information sets.

5. The semiconductor process analysis device according to claim 1, wherein
the processor is further configured to calculate a degree of association between a third appearance information set acquired from one of the first distribution groups and a device parameter, the device parameter being recorded in the fabrication process and including numerical information on each substrate.

6. The semiconductor process analysis device according to claim 5, wherein
one of the inspections is associated with one or more fabrication processes including the fabrication process,
the processor is further configured to:
acquire one or more device parameters including the device parameter during the one or more fabrication processes, and
in response to designation of the one of the inspections, calculate the degree of association between each of the one or more device parameters and the third appearance information set, and output a list containing the one or more device parameters in the order of the degree of association.

7. The semiconductor process analysis device according to claim 6, wherein
the processor is further configured to display the one or more device parameters in a form of a graph on a display.

8. The semiconductor process analysis device according to claim 1, wherein the processor is further configured to:
identify one first feature of one or more first features based on a fourth appearance information set acquired from one of the first distribution groups, the one or more first features each being associated with an analysis algorithm, and
analyze the fourth appearance information set by the analysis algorithm associated with the identified one first feature.

9. The semiconductor process analysis device according to claim 1, wherein
the factorization is non-negative matrix factorization.

10. The semiconductor process analysis device according to claim 1, wherein
the degree of association includes a correlation coefficient, a cosine similarity, a Euclidean distance, a Kullback-Leibler (KL) divergence, an accuracy, or an F-measure.

11. A semiconductor process analysis method, comprising:
performing factoring to each of first distribution groups resulting from inspections of a group of substrates, the inspections including an inspection of a fabrication process of a semiconductor integrated circuit, the first distribution groups each resulting from a single inspection among the inspections, each of the first distribution groups including first distributions, each of the first distributions being a distribution of inspection data on a surface of a substrate among the substrates, the factoring including performing factorization of a first distribution group among the first distribution groups into a product of one or more second distributions and one or more appearance information sets to acquire the one or more second distributions and the one or more appearance information sets, the one of more appearance information sets each containing a degree of appearance of one of the one or more second distributions in each of the substrates;
calculating a degree of association between two appearance information sets, the two appearance information sets respectively acquired from different first distribution groups among the first distribution groups; and
controlling an operation of the fabrication process based on the degree of association calculated.

12. The semiconductor process analysis method according to claim 11, wherein the calculating includes:
calculating the degree of association between a first appearance information set and each of second appearance information sets, the first appearance information set being an appearance information set acquired by the factoring to one of the first distribution groups resulting from a product inspection of quality of the semiconductor integrated circuit, the second appearance information sets each being an appearance information set acquired by the factoring to one of the first distribution groups resulting from the inspections of the fabrication process of the semiconductor integrated circuit.

13. The semiconductor process analysis method according to claim 11, further comprising:
  receiving designation of one of the one or more second distributions;
  calculating the degree of association between a first appearance information set and each of second appearance information sets acquired by the factoring to each of the first distribution groups, the first appearance information set corresponding to the designated second distribution; and
  outputting a list containing the second appearance information sets in the order of the degree of association.

14. The semiconductor process analysis method according to claim 13, further comprising:
  displaying the list on a display; and
  displaying, on the display, a pair of a first graph and a second graph in association with one of the second appearance information sets, the first graph representing the first appearance information set, the second graph representing one of the second appearance information sets contained in the list.

15. The semiconductor process analysis method according to claim 11, wherein
  the group of the substrates includes a first substrate group fabricated by a first fabrication device and a second substrate group fabricated by a second fabrication device different from the first fabrication device, and
  the calculating includes:
    acquiring, regarding each of the two appearance information sets, a first element appearance information set on the first substrate group and a second element appearance information set on the second substrate group; and
    calculating a first degree of association between two of first element appearance information sets and a second degree of association between two of second element appearance information sets.

16. The semiconductor process analysis method according to claim 11, further comprising:
  calculating a degree of association between a third appearance information set acquired from one of the first distribution groups and a device parameter, the device parameter being used in the fabrication process and including numerical information on each substrate.

17. The semiconductor process analysis method according to claim 16, wherein
  one of the inspections is associated with one or more fabrication processes including the fabrication process, the method further comprising:
    acquiring one or more device parameters including the device parameter during the one or more fabrication processes; and
    in response to designation of the one of the inspections, calculating the degree of association between each of the one or more device parameters and the third appearance information set; and
    outputting a list containing the one or more device parameters in the order of the degree of association.

18. The semiconductor process analysis method according to claim 17, further comprising:
  displaying the one or more device parameters in a form of a graph on a display.

19. The semiconductor process analysis method according to claim 11, further comprising:
  identifying one first feature of one or more first features based on a fourth appearance information set acquired from one of the first distribution groups, the one or more first features each being associated with an analysis algorithm; and
  analyzing the fourth appearance information set by the analysis algorithm associated with the identified one first feature.

20. A non-transitory, tangible computer-readable storage medium storing programmed instructions, wherein the instructions, when executed by a computer, cause the computer to execute:
  performing factoring to each of first distribution groups resulting from inspections of a group of substrates, the inspections including an inspection of a fabrication process of a semiconductor integrated circuit, the first distribution groups each resulting from a single inspection among the inspections, each of the first distribution groups including first distributions, each of the first distributions being a distribution of inspection data on a surface of a substrate among the substrates, the factoring including performing factorization of a first distribution group among the first distribution groups into a product of one or more second distributions and one or more appearance information sets to acquire the one or more second distributions and the one or more appearance information sets, the one or more appearance information sets each containing a degree of appearance of one of the one or more second distributions in each of the substrates;
  calculating a degree of association between two appearance information sets, the two appearance information sets respectively acquired from different first distribution groups among the first distribution groups; and
  controlling an operation of the fabrication process based on the degree of association calculated.

* * * * *